United States Patent [19]
Colangelo

[11] Patent Number: 6,127,885
[45] Date of Patent: Oct. 3, 2000

[54] CLASS D AMPLIFIERS INCLUDING TRANSITION ZONE MODULATION

[75] Inventor: Thomas Phillip Michael Colangelo, Hamden, Conn.

[73] Assignee: Cello, Limited, New Haven, Conn.

[21] Appl. No.: 09/143,831

[22] Filed: Aug. 31, 1998

[51] Int. Cl.[7] ................................................ H03F 3/38
[52] U.S. Cl. ........................................ 330/10; 330/207 A
[58] Field of Search ................................. 330/10, 207 A, 330/251; 332/107; 375/238, 239

[56] References Cited

U.S. PATENT DOCUMENTS

| | | | |
|---|---|---|---|
| 3,706,038 | 12/1972 | Austin et al. | 325/164 |
| 4,056,786 | 11/1977 | Morrison et al. | 330/207 A |
| 4,592,087 | 5/1986 | Killion | 381/68 |
| 4,649,565 | 3/1987 | Kaizer et al. | 381/90 |
| 4,689,819 | 8/1987 | Killion | 381/68 |
| 4,882,664 | 11/1989 | Pennington | 363/41 |
| 5,117,198 | 5/1992 | Morenz | 330/251 |
| 5,249,201 | 9/1993 | Posner et al. | 375/59 |
| 5,410,592 | 4/1995 | Wagner et al. | 379/388 |
| 5,594,386 | 1/1997 | Dhuyvetter | 330/251 |
| 5,617,058 | 4/1997 | Adrian et al. | 330/10 |
| 5,644,311 | 7/1997 | Choudhury et al. | 375/238 |
| 5,672,998 | 9/1997 | Wittlinger | 330/10 |

FOREIGN PATENT DOCUMENTS

| | | |
|---|---|---|
| 0 040 844 A1 | 12/1981 | European Pat. Off. . |
| WO 94/11799 | 5/1994 | WIPO . |

OTHER PUBLICATIONS

Dhuyvetter, "A New PWM Generator", Electronic Design, V. 44, No. 20, 1996, p. 30.

Nielsen, "High–Fidelity PWM–Based Amplifier Concept for Active Loudspeaker Systems With Very Low Energy Consumption", J. Audio Eng. Soc., V. 45, No. 7/8, Jul./Aug. 1997, pp. 544–570.

McGoldrick, "10–A, Full–Bridge Output Hybrid PWM Amplifier Delivers 94% Efficiency", Electronic Design, V. 45, No. 2, p. 109.

SGS Thomson Microelectronics, "SGS–Thomson Microelectronics TDA7260 High Efficiency Audio PWM Driver", Jun. 1988, pp. 789–801.

McLaughlin et al, "Audio Amplifier Efficiency and Balanced Current Design–A New Paradigm", Audio Engineering Society Convention, 1997, Paper 4600 (N–5), pp. 1–6.

Nielsen, "Pulse Edge Delay Error Correction (PEDEC)–A Novel Power Stage Error Correction Principle for Power Digital–Analog Conversion", Audio Engineering Society Convention, 1997, Paper 4602 (N–7), pp. 1–30.

Williams, "A Monolithic Switching Regulator with $100\mu V$ Output Noise", Linear Technology Application Note 70, Oct. 1997, pp. AN70–1 to AN70–72.

Sherman, "Class D Amplifiers Provide High–Efficiency for Audio Systems.EDN Design Feature", EDN, V. 40, No. 11, May 25, 1995 pp. 103.

Swager, "Power ICs: Weighing the Benefits of Integration", EDN, V. 39, No. 14, Jul. 7, 1994, p. 68.

*Primary Examiner*—Steven J. Mottola
*Attorney, Agent, or Firm*—Myers Bigel Sibley & Sajovec

[57] ABSTRACT

Class D amplifiers and methods dynamically modulate the transition zone of a square wave as a function of the input signal. Stated differently, the slew rate of the square wave is dynamically modulated as a function of the input signal. Stated in yet another way, at least one of the rise and fall times of the square wave is dynamically modulated as a function of the input signal. By dynamically modulating the transition zone of the square wave as a function of the input signal, a trapezoidal wave is produced, at least one of the rise and fall times of which are dynamically modulated as a function of the input signal. The trapezoidal wave need not have dead zones. This can reduce and preferably minimize switching losses. The slow rise and fall transition zone rates can also reduce and preferably minimize spurious switching noise at zero and low level modulation. Furthermore, damping network and diode losses may be reduced. Finally, very small differences of slew rate modulation may be produced, to thereby accurately quantify small signals. Improved class D amplifier circuits and methods are thereby provided.

75 Claims, 17 Drawing Sheets

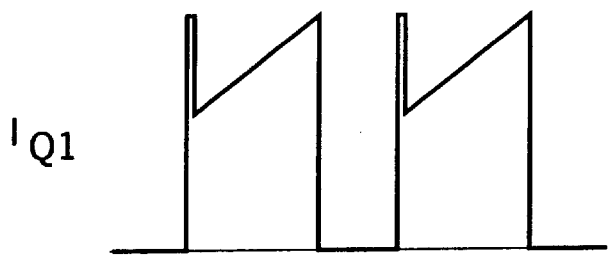
$I_{Q1}$
FIG. 4A
Prior Art
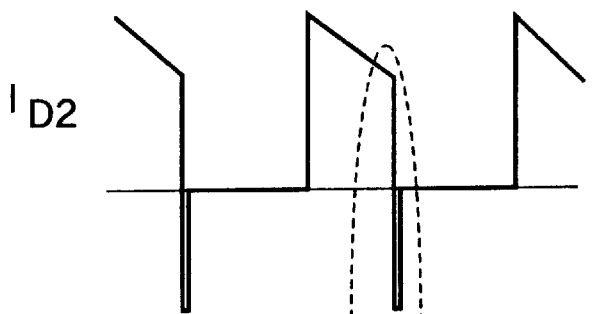
$I_{D2}$
FIG. 4B
Prior Art
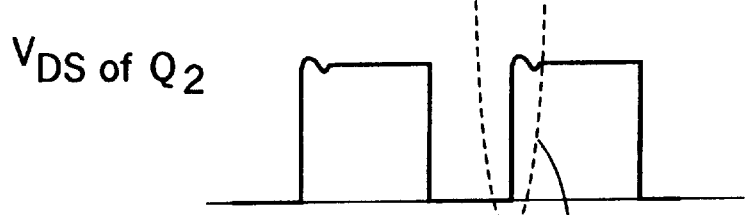
$V_{DS}$ of $Q_2$
FIG. 4C
Prior Art
Expanded Edge
FIG. 4D
Prior Art
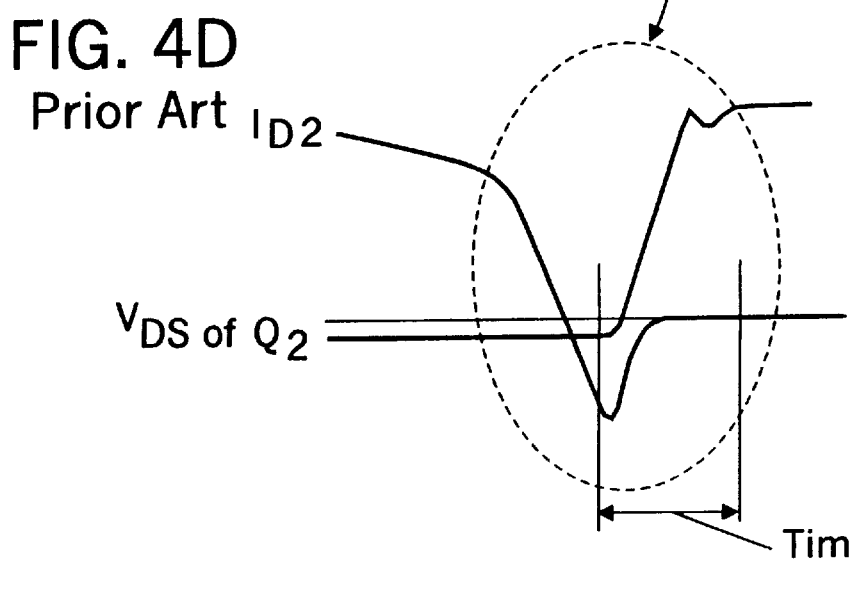
$I_{D2}$
$V_{DS}$ of $Q_2$
Time of Greatest Stress Positive Modulation Negative Modulation

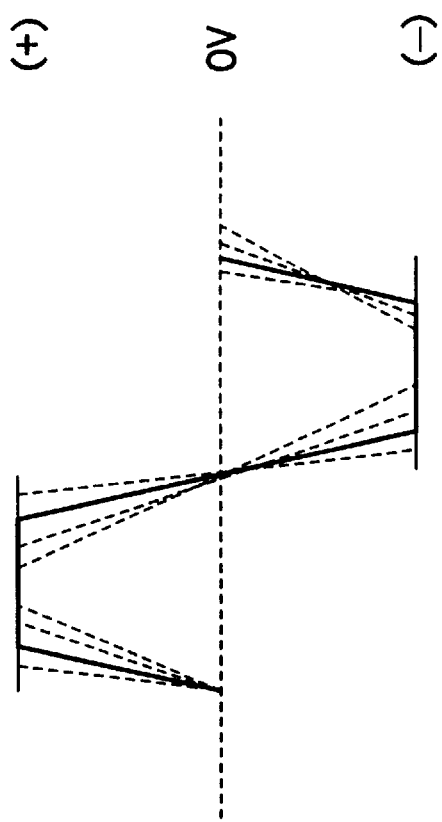
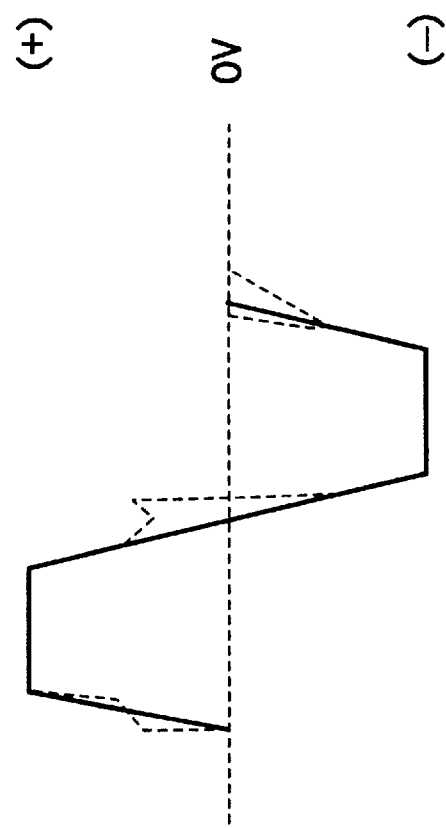

| FIG. 19A | FIG. 19B |

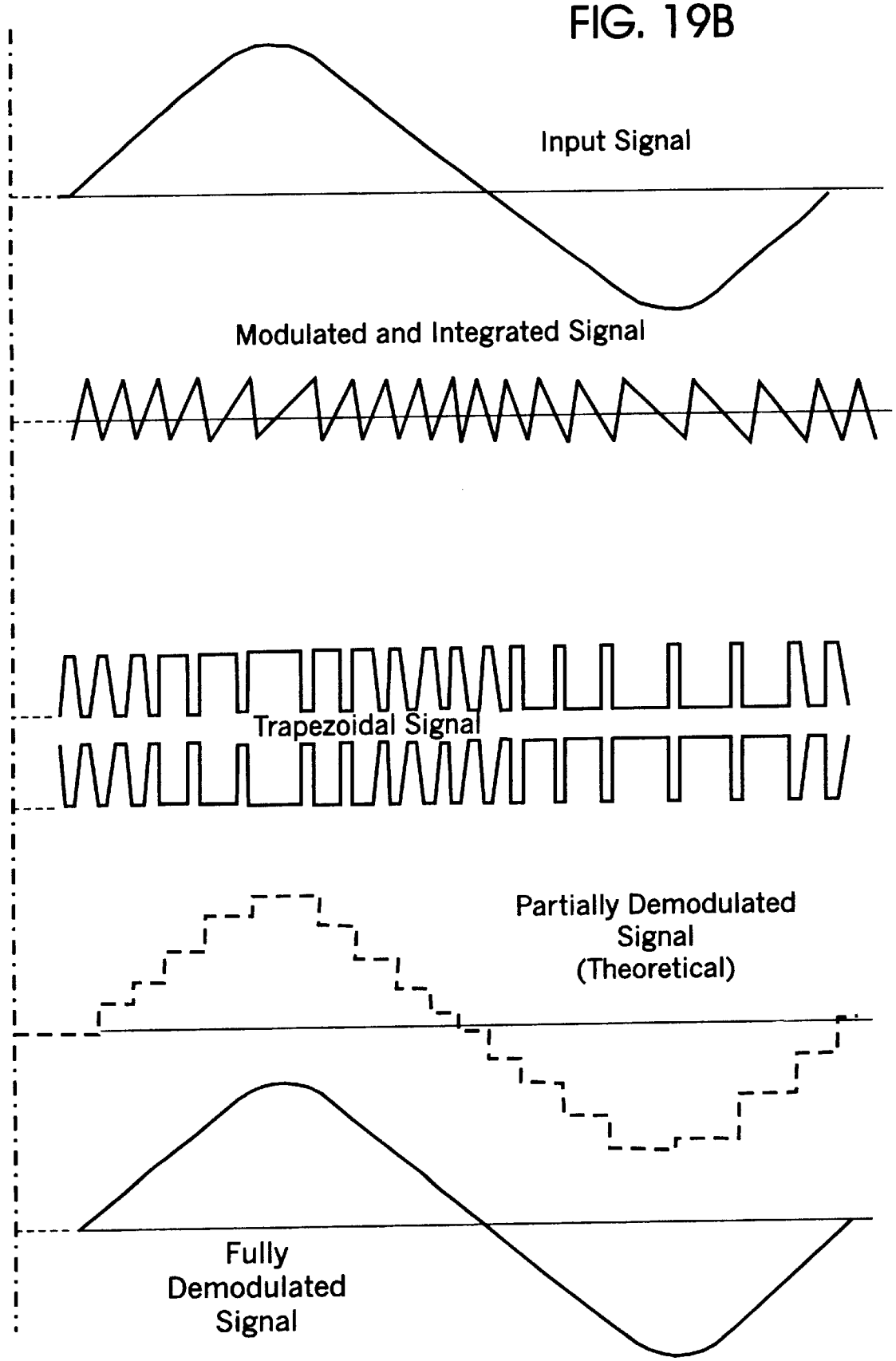

6,127,885

CLASS D AMPLIFIERS INCLUDING TRANSITION ZONE MODULATION

FIELD OF THE INVENTION

This invention relates to amplifier circuits and methods, and more particularly to class D amplifier circuits and methods.

BACKGROUND OF THE INVENTION

Class D amplifiers are well known to those having skill in the art. In particular, power amplifiers may be classified based on their output stages. In a class A amplifier, the output stage conducts for the entire cycle of the input signal. In contrast, the class B stage is biased at zero DC current. An intermediate stage class between A and B, referred to as class AB, biases the output stage at a non-zero DC current that is generally much smaller than the peak current of the input signal. Finally, in a class C amplifier, the output stage conducts for an interval shorter than that of the half cycle. Class A, AB and B amplifiers are widely used as output stages of operational amplifiers and audio power amplifiers. Class C amplifiers are often employed for radio frequency power amplification.

In contrast, a class D amplifier, sometimes called a "digital" amplifier, handles signals as on/off pulses using Duty-Cycle Modulation (DCM) including Pulse Duty Cycle Modulation (PDM), or Pulse Width Modulation (PWM). By using transistors as switches rather than as linear amplifiers, the class D amplifier may be highly efficient and small in size. Moreover, class D amplifiers may be capable of driving highly reactive loads with low power losses.

FIG. 1 is a simplified block diagram of a conventional class D amplifier. As shown in FIG. 1, a conventional class D amplifier 100 includes a digital or analog DCM or PWM modulator 104 that is responsive to a digital or analog input signal 102, to produce a duty cycle or width modulated square wave 114. A switching amplifier 106 is responsive to the duty cycle or width modulated square wave 114, to produce an amplified DCM/PWM square wave 116. The switching amplifier 106 may employ both positive (+) and negative (−) power supplies. A low pass filter 108 converts the amplified DCM/PWM square wave 116 into an analog output signal 112 that drives a load such as a loudspeaker 110.

Accordingly, class D amplifiers modulate the duty cycle or width of square wave pulses as a function of the input signal. When the volt-second area is identical for both the positive and negative pulses, the pulse cycle average is zero volts. This corresponds to a 50% duty cycle. By varying the duty cycle from the 50%, zero volt output state, the average output can be made positive or negative. The low pass filter 108 is used to "demodulate" the difference in duty cycle and therefore recover the modulating signal. The square wave or pulse frequency is generally set to meet the Nyquist criterion of at least twice the highest frequency to be amplified.

FIG. 2 graphically illustrates an input signal 102 and an amplified PDM square wave 116 of FIG. 1, to show the modulation of the duty cycle of a square wave as a function of the input signal 102. FIG. 3 illustrates the zero crossing of FIG. 2 in expanded form. The design and operation of the class D amplifiers are well known to those having skill in the art and need not be described further herein.

Unfortunately, despite the potential advantages of class D amplifiers noted above, practical limitations may preclude the use of class D amplifiers. In particular, in practice, a pulse frequency equal to or greater than four times the highest input signal frequency to be amplified is generally used. However, present day power devices may have limited switching speed and may therefore limit the switching frequency that can be used. This may place an upper limit on the pulse frequency, and may therefore limit the accuracy of the recovered signal.

For example, in a full bridge, four output transistors are generally used. In order to return any excess reactive energy, flyback diodes may be used. These diodes may be contained within the output transistors and/or arranged in reverse parallel with the output transistors. Two devices are arranged in series across the power supply on each side of the bridge. The load is placed midway between the output transistor nodes. The load is bridged across these nodes on each side of the bridge. Thus, the load is alternatively driven from the diagonally opposite output transistors on each side of the bridge.

Unfortunately, if the output transistors or their respective flyback diodes are still conducting current when the output stages alternate, a momentary short circuit can occur in the respective adjacent output transistor or diode, leading to common mode conduction. If not properly controlled, common mode conduction, also referred to as "shoot through", can occur in the power stages and may result in increases in power device dissipation, electromagnetic radiation, loss of efficiency and even possible destruction of the output devices.

In order to reduce the common mode conduction problem, "dead" time periods or zones between the pulses may be used. Unfortunately, the use of dead time periods may create their own problems. In particular, during the dead time, the output of the power section may not be under control. Dead time may also represent an upper limit on modulation.

Moreover, flyback diode recovery can create problems due to the slow nature of the flyback diodes. Diode recovery effects may be a major cause of power switching losses in class D amplifiers. FIGS. 4A–4D graphically illustrate an example of diode recovery in a half bridge circuit. It will be understood that in FIGS. 4A–4D, for simplification, the upper half of the bridge is driven without driving the bottom half of the bridge. FIG. 4A illustrates the current in a first output transistor ($I_{Q1}$). FIG. 4B illustrates diode current in a second flyback diode ($I_{D2}$). FIG. 4C illustrates the drain-to-source voltage ($V_{DS}$) of a second output transistor ($Q_2$). Finally FIG. 4D is an expansion of FIGS. 4B and 4C, to illustrate the time of greatest stress in the class D amplifier.

In addition to causing switching power losses, a considerable amount of spurious switching noise or ringing may be generated by the finite switching times of the power devices interacting with stray inductances and/or stray capacitances. This spurious noise may create additional errors in the duty cycle displacement. This switching noise is generally highly variable depending on, for example, load, supply voltages, duty cycle frequency and duty cycle. Since this noise is not predictably symmetrical and is of a high frequency nature, it may be difficult to reduce or eliminate. Damping networks placed across the outputs of the power stage can reduce spurious switching transients. However, these damping networks may themselves cause losses.

FIGS. 5A and 5B illustrate typical waveforms in a high speed switching power circuit. FIG. 5A illustrates the drain current of an output transistor and FIG. 5B illustrates the drain-to-source voltage of an output transistor. As shown, each of these waveforms includes spurious ringing. Accordingly, the use of dead time periods and the generation of spurious noise may place a limit on the accuracy of class D amplifiers, particularly at low modulation levels. This may be considered analogous to "quantization error" if the class D amplifier is regarded as a digital amplifier. Alternatively, it may be considered analogous to "crossover" or "notch" distortion in a conventional linear amplifier of class B.

One attempt at reducing or eliminating dead time in a class D amplifier is described in "Audio Amplifier Efficiency and Balanced Current Design—A New Paradigm" by McLaughlin et al, Audio Engineering Society Convention, 1997, Paper 4600 (N-5), pp. 1–6. The "Balanced Current Design" turns the opposite polarity output switches on and off simultaneously, instead of alternately. Unfortunately, it may produce asymmetry, since only one half of the diagonal bridge is active devices. Thus, the other half utilizes energy stored in the output inductors from the previous half cycle in order to complete the output waveform. Additional common mode noise may also be created, due to the special timing arrangement of the power switches. Finally, it may not offer any additional error correction capability beyond the primary duty cycle control mechanism.

Another recent attempt at overcoming the above problems is described in "Pulse Edge Delay Error Correction (PEDEC)-A Novel Power Stage Error Correction Principle for Power Digital-Analog Conversion", by Nielsen, Audio Engineering Society Convention, 1997, Paper 4602 (N-7), pp. 1–30. Pulse edge delay error correction is used to correct power stage error sources. Unfortunately, this approach may be limited in the ability to make very fine corrections.

Finally, yet another recent attempt at overcoming switching noise problems is described in Linear Technology Application Note 70 by Williams, entitled "A Monolithic Switching Regulator with 100 $\mu V$ Output Noise", October 1997, pp. AN701 to AN70–72. Application Note 70 discloses a low noise monolithic switching regulator referred to as the LT1 533, in which the voltage and current slew rates are independently settable by external programming resistors. Thus, as described therein, the transition time may be set at the fastest rate permitting desired noise performance using the external programming resistors.

In summary, class D amplifiers are theoretically advantageous, but may present common mode conduction and switching noise problems. Despite attempts to solve these and other problems, there continues to be a need for class D amplifiers that can reduce or eliminate these problems.

SUMMARY OF THE INVENTION

It is therefore an object of the present invention to provide improved class D amplifier circuits and methods.

It is another object of the present invention to provide class D amplifier circuits and methods that can reduce common conduction problems.

It is yet another object of the present invention to provide class D amplifier circuits and methods that can reduce common conduction problems while also reducing dead time.

It is still another object of the present invention to provide class D amplifier circuits and methods that can reduce common conduction, dead time and/or switching noise.

These and other objects are provided according to the present invention, by class D amplifiers and methods that dynamically modulate the transition zone of the square wave as a function of the input signal. Stated differently, the slew rate of the square wave is dynamically modulated as a function of the input signal. Stated in yet another way, at least one of the rise and fall times of the square wave is dynamically modulated as a function of the input signal.

By dynamically modulating the transition zone of the square wave as a function of the input signal, a trapezoidal wave is produced, at least one of the rise and fall times of which are dynamically modulated as a function of the input signal. The trapezoidal wave need not have dead zones. This can reduce and preferably minimize switching losses. The slow rise and fall transition zone rates can also reduce and preferably minimize spurious switching noise at zero and low level modulation. Furthermore, damping network and diode losses may be reduced. Finally, very small differences of slew rate modulation may be produced, to thereby accurately quantify small signals. Improved class D amplifier circuits and methods are thereby provided.

More specifically, class D amplifiers according to the invention include a first circuit that dynamically modulates the transition zone of a square wave as a function of an input signal, and a second circuit that converts the square wave so modulated into an analog output signal. Stated differently, the first circuit dynamically modulates the slew rate of a square wave as a function of the input signal, and the second circuit converts the square wave so modulated into the analog output signal. Stated in another way, the first circuit dynamically modulates at least one of the rise and fall times of a square wave as a function of the input signal, and the second circuit converts the square wave so modulated into the analog output signal. Accordingly, the first circuit produces a trapezoidal wave, at least one of the rise and fall times of which are dynamically modulated as a function of the input signal. The second circuit converts the trapezoidal wave into the analog output signal. The second circuit preferably comprises a low pass filter to demodulate the trapezoidal wave.

Preferably, at least one of the width and the duty cycle, and at least one of the rise and fall times of the trapezoidal wave are dynamically modulated as a function of the input signal. More specifically, at least one of the rise and fall times is increased in inverse proportion to the amplitude of the input signal, and more preferably in inverse proportion to the DC value of the input signal. Stated alternatively, the slew rate is increased in direct proportion to the DC value of the input signal. Also preferably, both the rise and fall times are dynamically modulated as a function of the input signal. However, alternatively, only one of the rise and fall times are dynamically modulated as a function of the input signal.

In a particular embodiment of the present invention, class D amplifiers include a duty cycle or width modulator that dynamically modulates the duty cycle or width of a square wave as a function of the input signal. A rate modulator is responsive to the duty cycle or width modulator and to the input signal, to dynamically modulate at least one of the rise and fall times of the duty cycle or width modulated square wave, to thereby produce the trapezoidal wave. An AC-to-DC converter may also be included that converts the input signal to DC, and that supplies the input signal so converted to the rate modulator. Thus, the rate modulator is preferably responsive to the DC level of the input signal.

A linear amplifier may also be connected between the first circuit and the second circuit, to amplify the trapezoidal wave. A linear amplifier is preferably used to accurately amplify the trapezoidal wave. This contrasts from conventional class D amplifiers, wherein a switching amplifier is preferably used to amplify a square wave. Improved class D amplifiers and amplification methods are thereby provided.

BRIEF DESCRIPTION OF THE DRAWINGS

FIGS. 4A, 4B, 4C and 4D graphically illustrate examples of diode recovery in a conventional half bridge circuit of a class D amplifier.

FIGS. 9A and 9B describe other alternate waveforms that can be produced by amplifiers of FIG. 6.

FIGS. 19A and 19B illustrate modification of the conventional class D amplifier circuit of FIG. 18 according to the present invention.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 6:
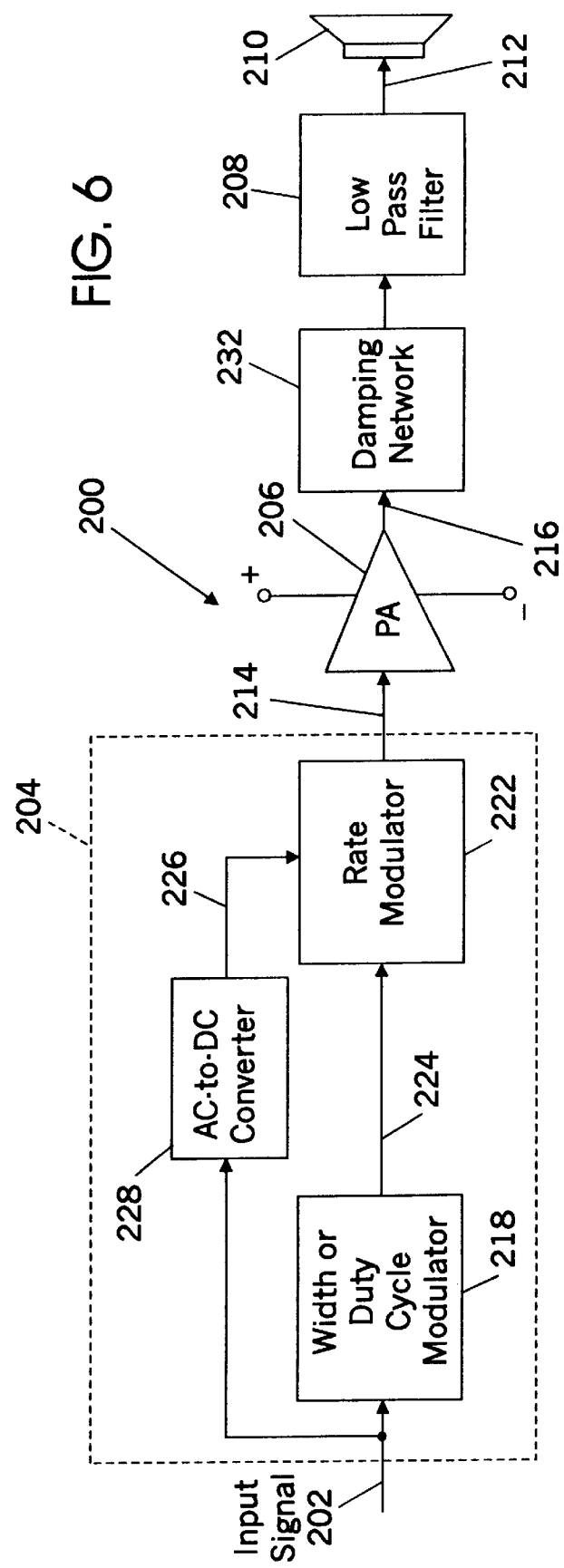
FIG. 6 is a simplified block diagram of class D amplifiers and amplifying methods according to the present invention.

Referring now to FIG. 6, a simplified block diagram of class D amplifiers and amplifying methods according to the present invention is illustrated. As shown in FIG. 6, class D amplifiers 200 according to the present invention include a first circuit 204 that produces a trapezoidal wave, at least one of the rise and fall times of which are dynamically modulated as a function of the input signal 202. A second circuit, such as a low pass filter 208, converts the trapezoidal wave into an analog output signal 212 that drives a load such as a loudspeaker 210.

Continuing with the description of FIG. 6, the first circuit 204 includes a width or duty cycle modulator 218 that dynamically modulates the duty cycle and/or width of a square wave as a function of the input signal, to produce a duty cycle modulated square wave 224. A duty cycle modulated square wave is illustrated in FIG. 7A.

The first circuit 204 also includes a rate modulator 222 that is responsive to the width or duty cycle modulator 218 and that is directly or indirectly responsive to the input signal 202, to dynamically modulate at least one of the rise and fall times of the dynamically modulated square wave 224, to produce a trapezoidal wave, at least one of the rise and fall times of which are dynamically modulated as a function of the input signal. An example of the dynamically modulated trapezoidal wave 214 is illustrated in FIG. 7B.

The rate modulator 222 may be directly responsive to the input signal 202. However, preferably, the rate modulator is responsive to the DC value of the input signal. Thus, an AC-to-DC converter 228, for example a rectifier, is responsive to the input signal 202 to produce a rectified input signal 226 that is supplied to the rate modulator 222.

It will be understood by those having skill in the art that first circuit 204 may also be thought of as dynamically modulating at least one of the rise and fall times of a square wave as a function of the input signal. Alternatively, first circuit 204 may be thought of as dynamically modulating the slew rate of a square wave as a function of the input signal. In yet another alternative, first circuit 204 may be generally thought of as dynamically modulating the transition zone of a square wave as a function of the input signal. By dynamically modulating the transition zone of a square wave as a function of the input signal, dead time can be reduced and preferably eliminated, and noise can also be reduced. Thus, the transition zones of the square wave are deliberately deployed as controllable areas of switching loss, and not merely managed.

Still continuing with the description of FIG. 6, Class D amplifier 200 also includes a power amplifier 206. In contrast with a switching power amplifier of conventional class D amplifiers, the power amplifier 206 is preferably a linear power amplifier that saturates cleanly, i.e. that exhibits controlled clipping. Thus, the linear power amplifier 206 is capable of accurately amplifying the trapezoidal wave 214. The Power amplifier 206 preferably returns energy to its positive (+) and negative (−) supply rails from its output via antiparallel diode clamps.

The amplified trapezoidal waveform 216 is provided to a low pass filter 208, such as a series inductor, to produce an analog output signal 212 that is supplied to the loudspeaker 210. A damping network 232, for example a series connected resistor and capacitor, may be used to damp the output of the power amplifier 206. The damping network 232 is also referred to as a "snubber".

It will be understood that either the rise time or the fall time, or both the rise time and the fall time of the trapezoidal wave, may be dynamically modulated as a function of the input signal according to the present invention. In single-ended power stages, only the rise time may be highly controllable by device drive since the fall time behavior may be highly load dependent. In these situations, only the rise time need be controlled, which can indirectly affect the fall time behavior via the amount of energy stored in the load filter, and therefore affect the load commutated turn-off of the power switches. Moreover, additional control of the turn-off (fall time) behavior is still possible at a slower rate than is provided by the load commutated turn-off. Indeed, transition zone modulation according to the invention can offer many of the benefits in a single-ended switching power stage, that are offered with full push-pull power circuits. Accordingly, either the rise time, the fall time or both may be dynamically controlled as a function of the input signal.

Figure 7C:
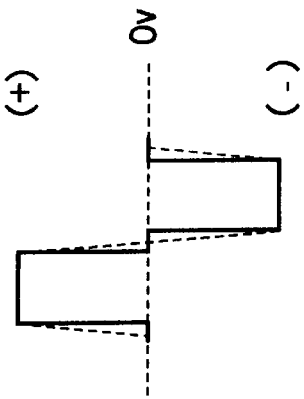
FIG. 7C contrasts a trapezoidal wave with a conventional square wave with dead time.
Figure 7B:
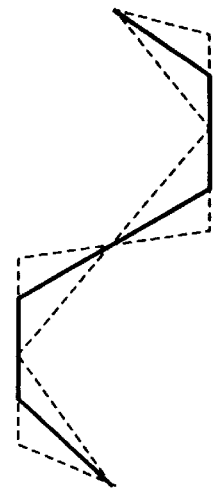
FIGS. 7A–7B graphically illustrate waveforms produced by amplifiers of FIG. 6.
Figure 7A:
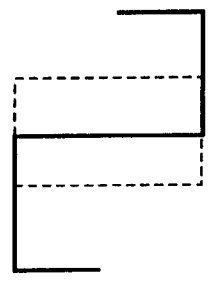

FIG. 7C graphically illustrates normalized voltage-second area of a 50% duty cycle quasi-square wave shown by the solid lines in comparison to a trapezoidal wave as produced by the present invention, shown by the dashed lines. The trapezoidal wave also has a 50% duty cycle. The waveform shown in solid lines is called a quasi-square wave, because of the dead zones about the zero volt axis, shown by the dashed horizontal lines. These dead zones can be used to reduce common mode conduction and in conventional class D amplifiers. Dead zones are created by producing dead times in the drive signal.

In sharp contrast, as shown in FIG. 7C, the dashed line trapezoidal waveform need not include dead zones. In general, the rate modulator 222 of FIG. 6 may be set up with the slowest rise and fall rates at 50% duty cycle. The slowest rise and fall times can be used to reduce and preferably minimize switching losses, because while the transition losses may be relatively high, the load is relatively low. These slow rise and fall transition zone rates can also reduce and preferably minimize spurious switching noise at zero and low level modulation. The trapezoidal waveform also can be generated with good symmetry. High frequencies that result from the transition zone modulator are preferably above the frequency band that is being amplified, and can therefore be filtered out by the low pass filter 208. Moreover, damping network and diode commutation losses may also be reduced. Very small differences of the volt-second area can be reliably produced. Therefore, small signals may be accurately quantified.

Figure 8A:
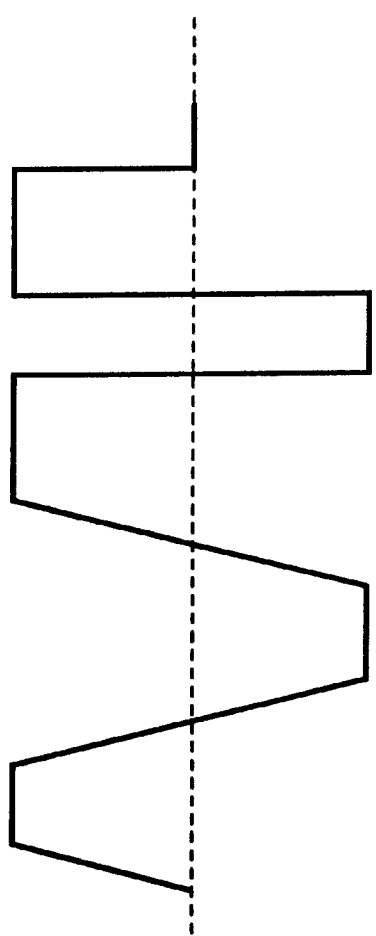
FIGS. 8A and 8B illustrate alternate embodiments of waveforms that can be produced by amplifiers of FIG. 6.
Figure 8B:
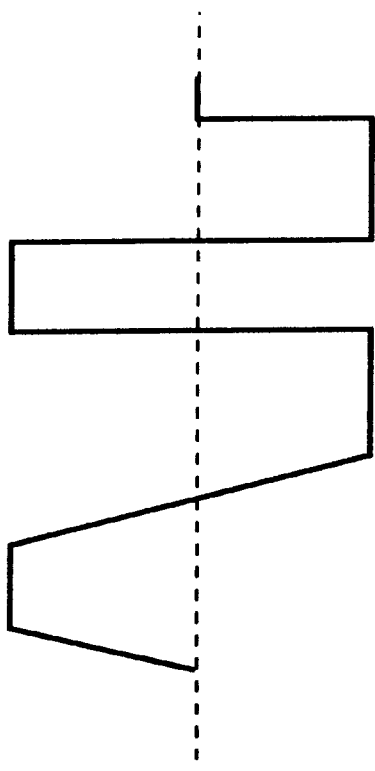

As described above in connection with FIG. 6, the rate modulator 222 is responsive to the duty cycle modulator and to the input signal, to dynamically modulate at least one of the rise and fall times of the width or duty cycle-modulated square wave 224, to produce the trapezoidal wave 214. Preferably, the rate modulator 222 is responsive to the DC component of the input signal. In response to a large DC component, a short rise time or a high slew rate is provided for the trapezoidal wave. Conversely, in response to a small DC component of the input signal, a long rise time or a low slew rate is provided for the trapezoidal wave. Thus, the rise and fall times are preferably reduced, or the slew rate is preferably increased, as the amplitude of the input signal is increased. This is illustrated in FIGS. 8A and 8B. The minimum rise and fall times are preferably limited to the fastest rates the amplifier can reasonably handle.

FIGS. 9A and 9B show a basic rate modulation waveform in solid line, as well as rate modulation of the positive leading edge and trailing negative edge in dotted lines. FIG. 9B illustrates that bipolar modulation is possible by introducing an additional transition in the rise time and/or fall time as shown by the dotted lines.

Accordingly, additional fine error correction may be possible by varying the transition zone parameters about their nominal values. At least five possible transition zone modulation scenarios may be provided:

(1) Overall: Changing the rise and fall times together. See FIG. 9A.
(2) Positive: Changing the rise and/or fall time of the positive portion of the square wave.
(3) Negative: Changing the rise and/or fall time of the negative portion of the square wave.
(4) Per Cycle Correction: Changing either the rise or fall time for one cycle.
(5) Additional bipolar modulation may be mixed with the square wave. See FIG. 9B.

Amplitude correction in scenario (1) can affect the overall volt-second area of the square wave. Amplitude correction in scenarios (2)–(4) may be used to either increase or decrease the volt-second area of either the positive or negative portion of the output waveform and to correct the output waveform symmetry. In addition, scenarios (2) and (3) can be used to control the commutation transitions from the output transistor to diode clamps and from the diode clamps to output transistors. Correction scenarios (2), (3) and (4) are asymmetrical in effect and therefore can also be used to correct for even-order nonlinearities. The correction scenarios can be used alone or in combination.

It will also be understood that transition zone modulation also can be used to limit carrier frequency changes in certain "free running" class D amplifier technologies. When incorporating transition zone modulation in certain free-running and/or servo-controlled systems, special compensation tactics may be used to prevent overshoot. Indeed, compensation for overshoot is often needed even if transition zone modulation is not applied. Transition zone modulation can allow greater control of this parameter.

Figure 2:
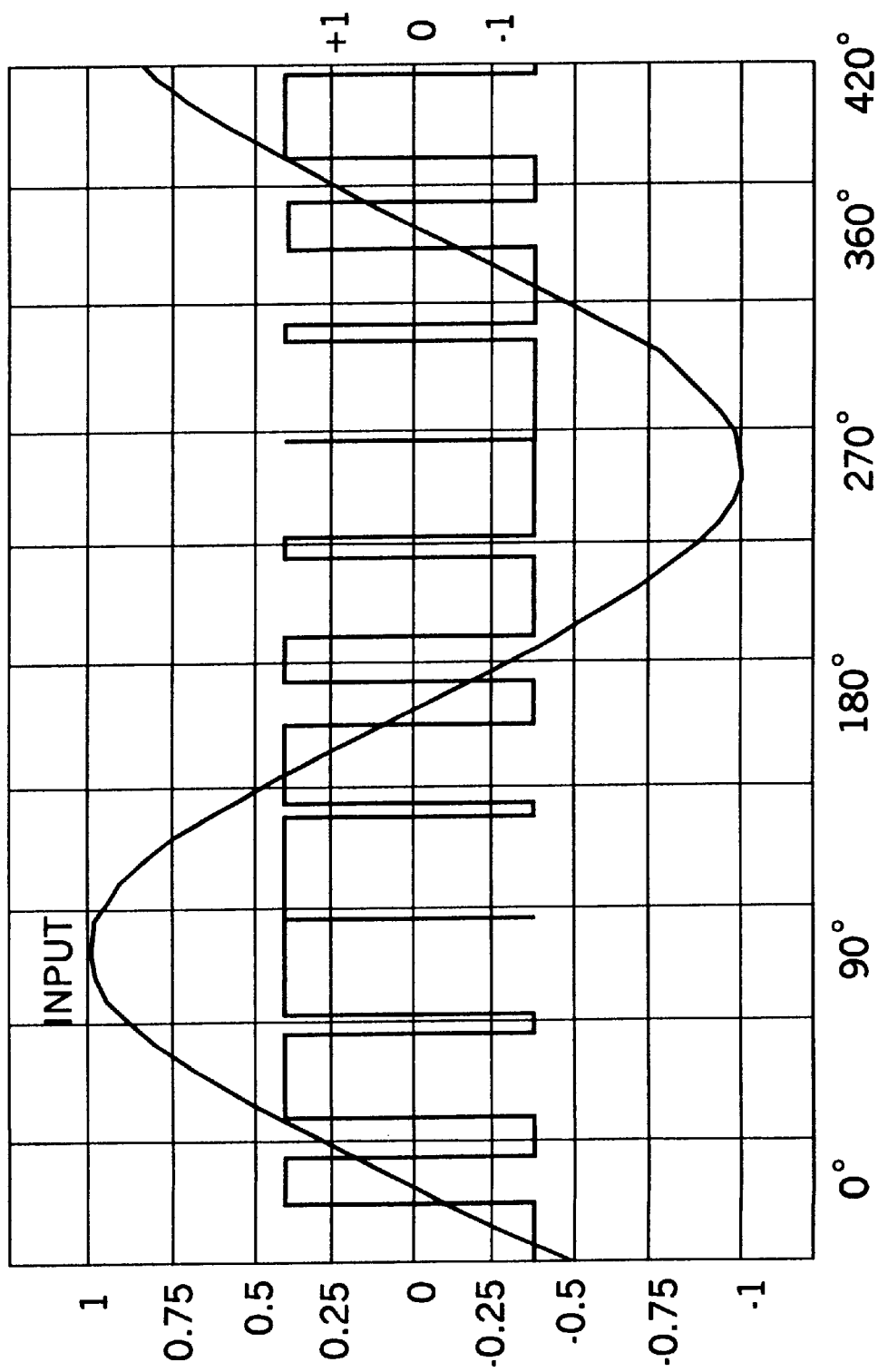
FIG. 2 graphically illustrates an input signal and an amplified pulse duty modulated square wave for a conventional class D amplifier of FIG. 1.
Figure 11:
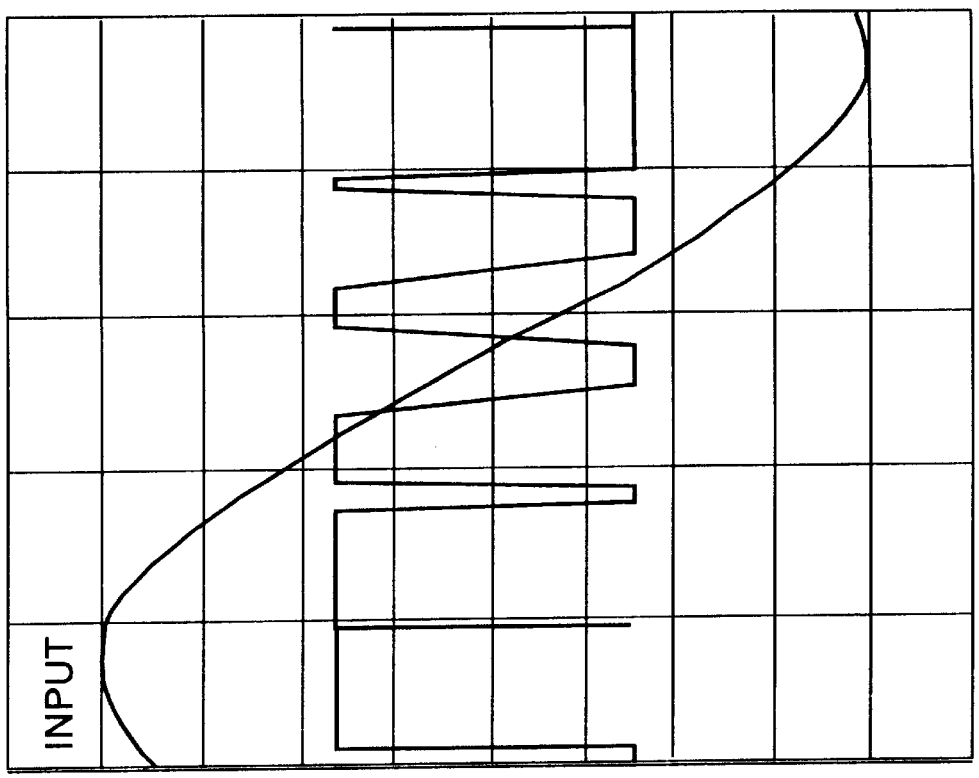
FIG. 11 is an expanded view of the waveforms of FIG. 10 at the zero crossing.
Figure 3:
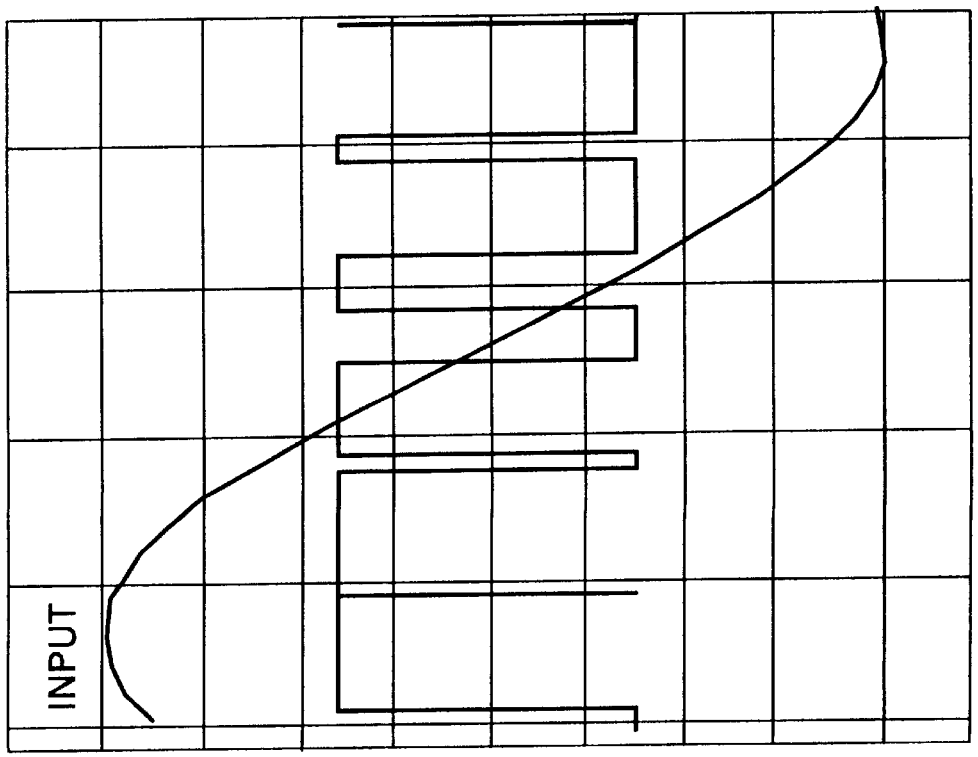
FIG. 3 illustrates the zero crossing of FIG. 2 in expanded form.
Figure 10:
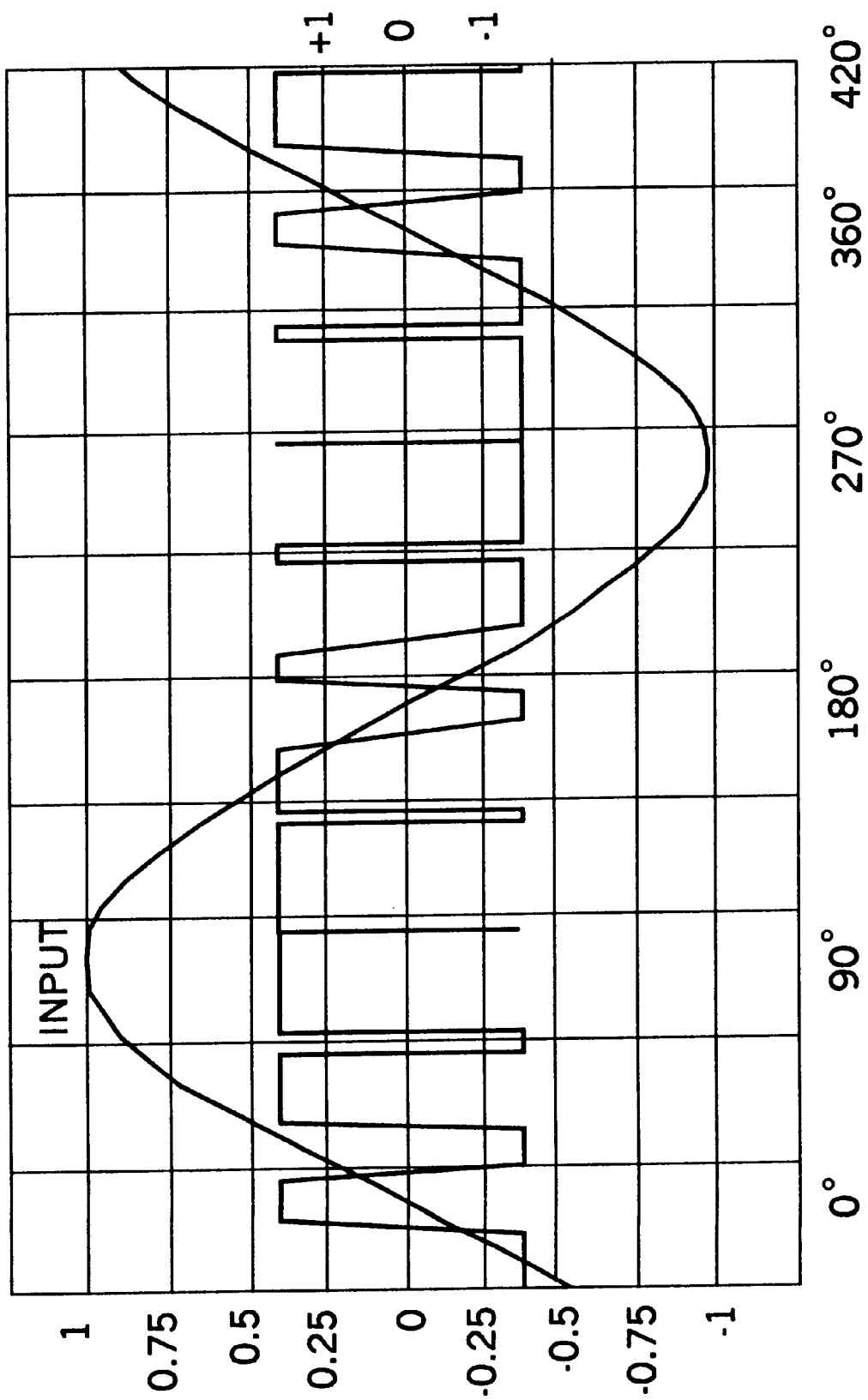
FIG. 10 graphically illustrates an input signal and a trapezoidal wave for amplifiers of FIG. 6.

FIG. 10 graphically illustrates input signal 202 and the trapezoidal wave 214 for class D amplifiers of FIG. 6. FIG. 11 is an expanded view of these waveforms at the zero crossing point. The output waveforms of FIGS. 10 and 11 may be contrasted with the output waveforms of FIGS. 2 and 3 for a conventional class D amplifier. In FIGS. 2 and 3, the output waveforms are duty cycle modulated square waves. In contrast, the output waveforms of FIGS. 10 and 11 are duty cycle modulated and rise and fall time modulated trapezoidal waves.

Three examples of implementations of class D amplifiers and methods according to the invention will now be described. The first implementation will describe discrete circuits that can be used in a class D power amplifier according to the present invention. The second and third examples will illustrate modifications of conventional integrated circuits to incorporate transition zone modulation according to the present invention.

Discrete Amplifier Circuit

A discrete amplifier circuit including transition zone modulation according to the invention will now be described in connection with FIGS. 12A–17B. A discrete audio amplifier will be described. It will be understood that amplifiers according to FIG. 12A–17B may also be implemented in one or more integrated circuits.

Figure 12A:
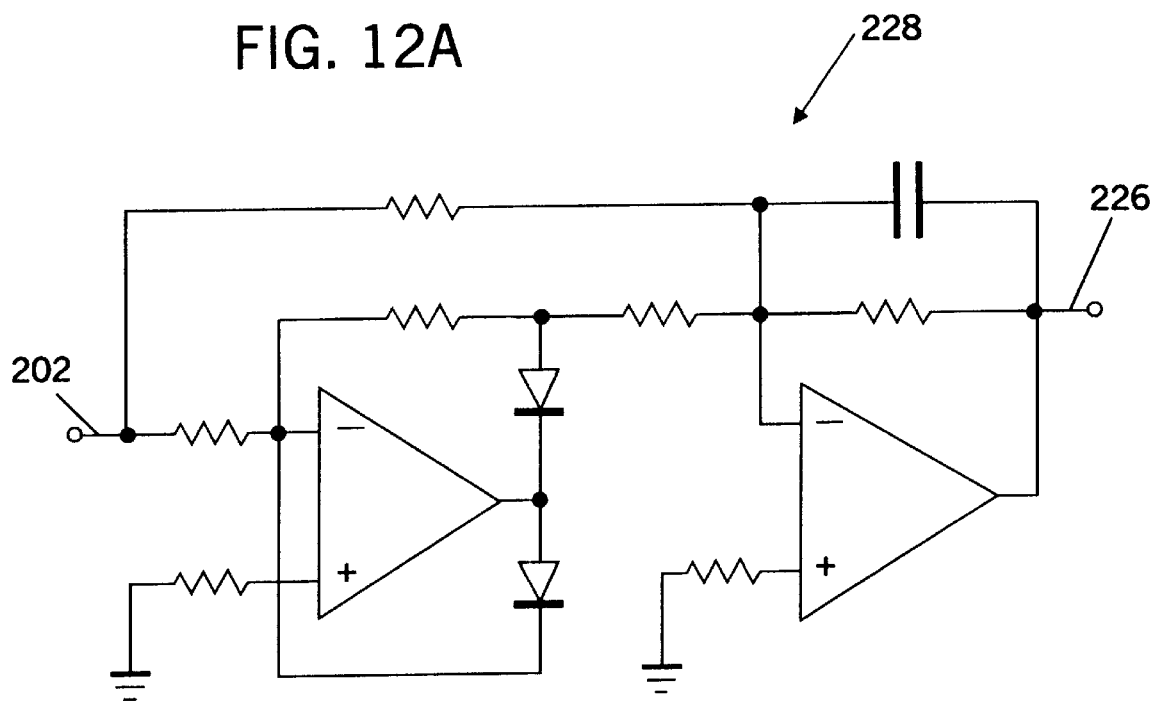
FIGS. 12A and 12B illustrate a precision full wave rectifier circuit and a rate modulator, respectively, according to an embodiment of the present invention.
Figure 12B:
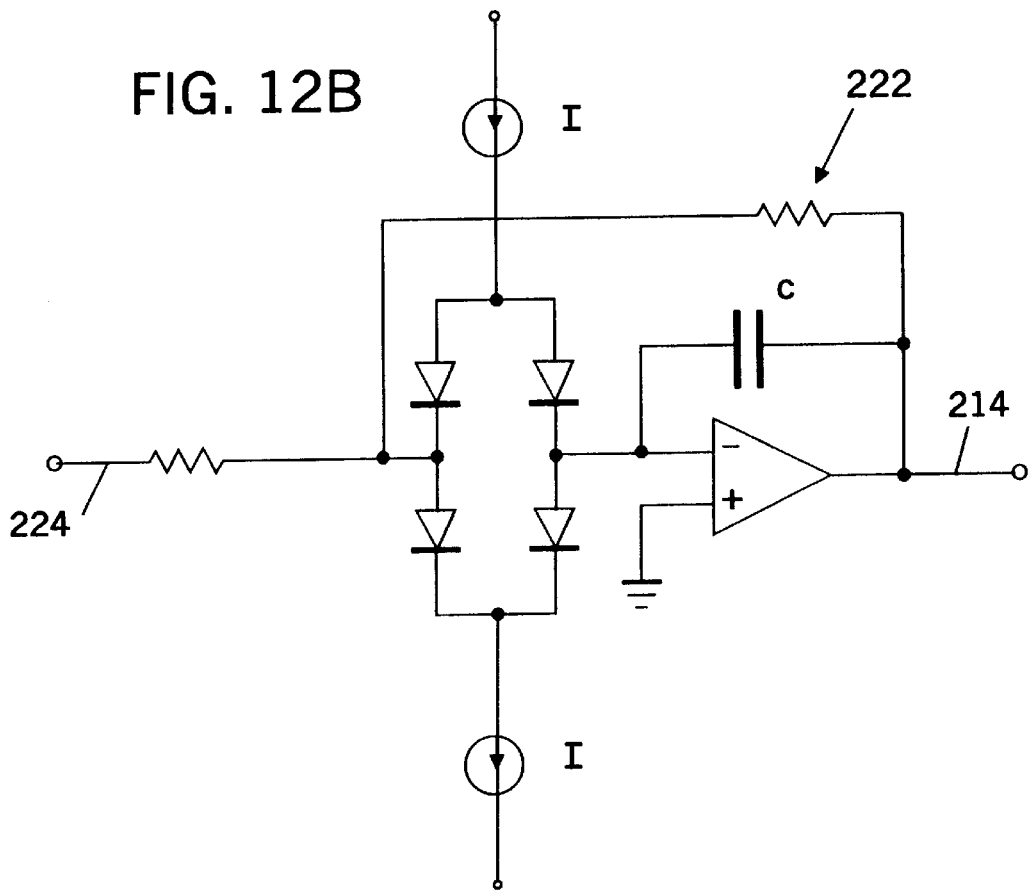

Referring back to FIG. 6, the details of width or duty cycle modulators 218 need not be described herein because many examples of width or duty cycle modulators are well known to those having skill in the art. FIG. 12A illustrates an example of a precision full-wave rectifier circuit that can function as the AC-to-DC converter 228 of FIG. 6. FIG. 12B illustrates a simplified example of a rate modulator 222 of FIG. 6. It will be understood that the rate modulator 222 of FIG. 12B operates as a slew rate limiter where the slew rate S is equal to the current I divided by the capacitance C.

Figure 13:
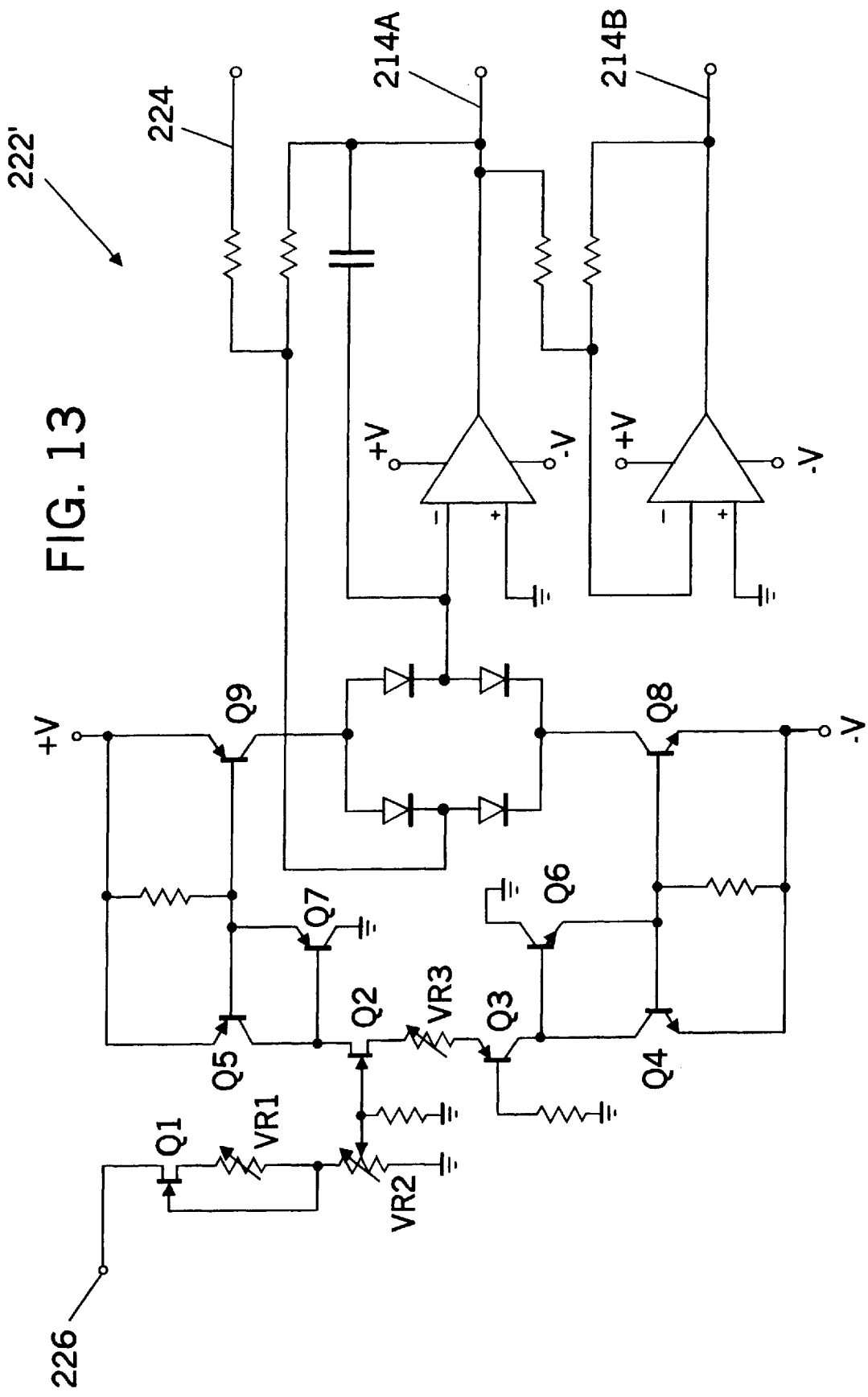
FIG. 13 is a schematic diagram of an alternate rate modulator according to an embodiment of the present invention.

FIG. 13 is a schematic diagram of a more sophisticated rate modulator 222' including a slew rate limiter. As was the case in FIG. 12B, S=I/C in this circuit. Transistors Q2 and Q3 form the non-inverting and inverting inputs of the rate modulator 222'. These input transistors control the positive and negative current sources comprised of transistors Q5, Q7 and Q9, complemented by transistors Q4, Q6 and Q8, respectively. Driving the rate controller input 226 positive will decrease the rise and fall times. Conversely, negative drive will increase the transition time. Variable resistor VR2 controls gain of the rate modulator. Variable resistor VR3 sets the initial current range.

In order to limit the range of action of the rate modulation in relation to the overall duty cycle modulation, an adjustable current source including transistor Q1 and variable resistor VR1 is placed between the output of the AC-to-DC converter and the input 226 of the rate modulator. This current source is adjusted to restrict the rate modulation to lower levels of overall modulation.

The relationship between transition rate and the voltage-second area of the transition zone is preferably linear. This can be explained by considering the total transition zone as a rectangular area whose diagonals represent the actual loci of transit. The width of the transition zone is directly proportional to the transition time. The amplitude of the width or duty cycle modulator 218 is assumed to be fixed. Therefore, only the width varies with transition rate, which varies directly with current I, resulting in a directly proportional relationship between the abovementioned parameters and the volt-second area of the transition zone.

The exact adjustment of the rate modulator modulation parameters may be dependent on the particular class D amplifier topology, servo loop (if used) and the overall operating conditions. The width or duty cycle modulated signal is applied to the DCM or PWM input 224 of the rate modulator 222'. This signal can be generated by either analog or digital width or duty cycle modulators 218. Alternatively, the rate modulator can be digitally interfaced.

Figure 14:
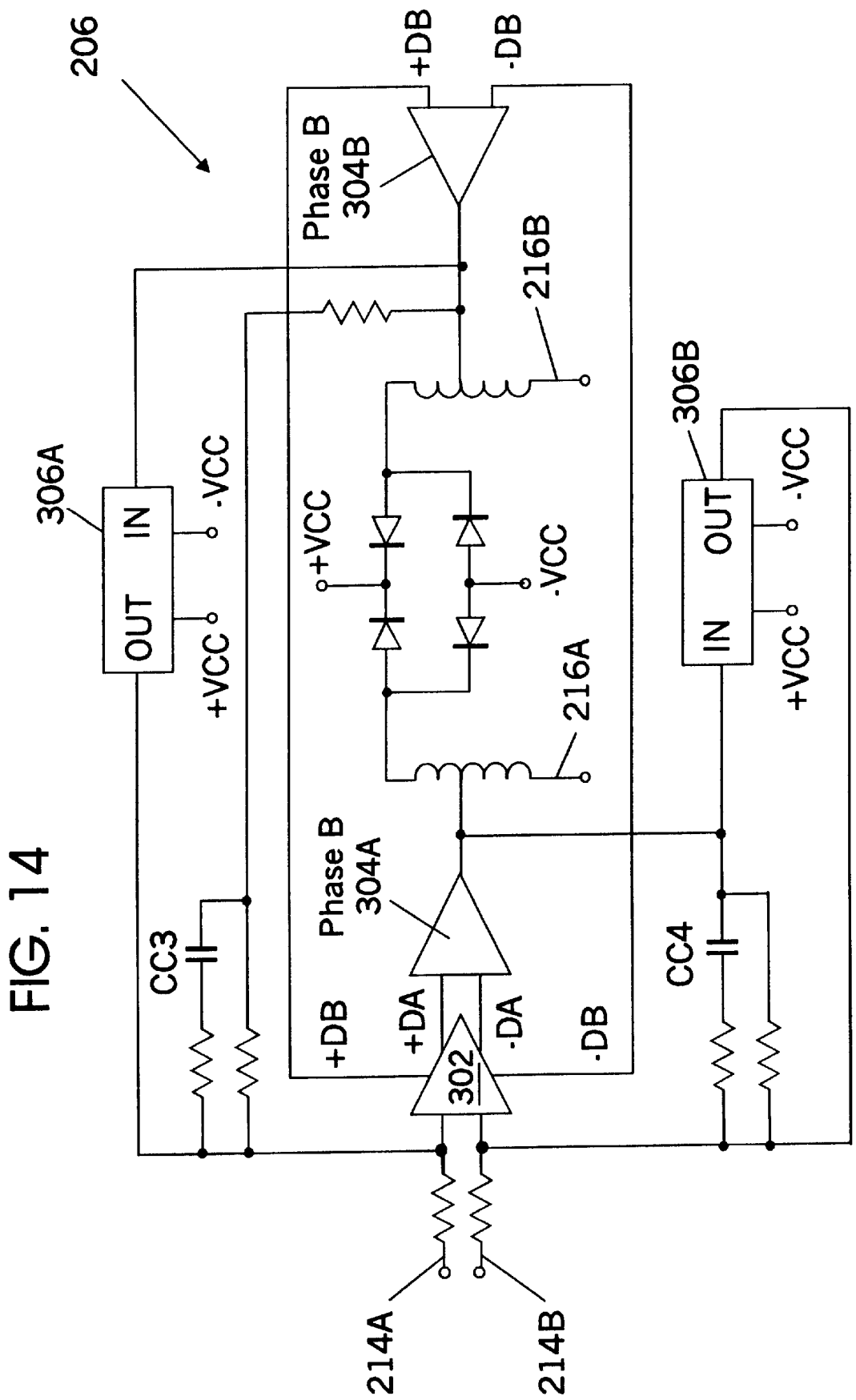
FIG. 14 is an overall block diagram of a power amplifier according to an embodiment of the present invention.

FIG. 14 is an overall block diagram of an embodiment of a power amplifier 206 of FIG. 6. As shown in FIG. 14, the power amplifier 206 includes an input and voltage gain section 302 and a pair of driver and output stages 304A and 304B. A pair of soft clip circuits 306A and 306B are also included.

Figure 15:
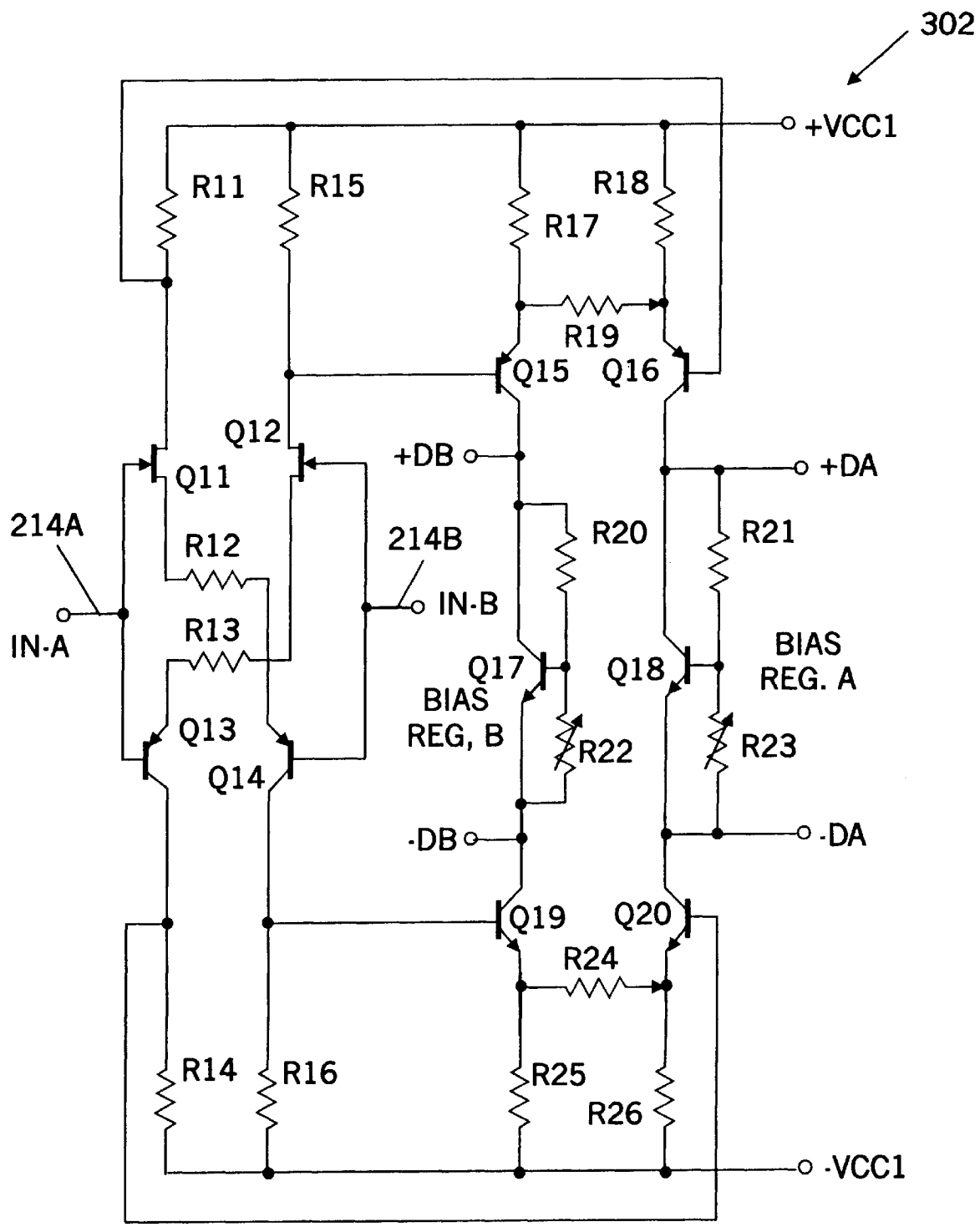
FIG. 15 is a circuit diagram of an input and voltage gain stage for a power amplifier of FIG. 14.

FIG. 15 is a circuit diagram of an embodiment of the input and voltage gain stage 302, also referred to as an input predriver section. Transistors Q11, Q12, Q13 and Q14 are arranged as a cross-coupled complementary differential amplifier that drives the second stage differential amplifiers including transistors Q15 and Q16, complemented by transistors Q19 and Q20. Bias regulators A and B provide idle bias for the drivers and output stages. The amount of bias and bias regulator configuration may be selected for the specific application. For very high speed applications, under-biasing can be used. This can create a dead zone that can be traded off against switching delay times.

This dead zone can be finely controlled with proper biasing. The dead zone is also reduced by the overall inverse feedback of the linear amplifier. Moreover, the net resultant dead zones generally are only a small portion of the entire output waveform. They may be considered analogous to notch (crossover) distortion in an under-biased class B amplifier. Unexpectedly, when a class B linear amplifier is adapted and used as a power stage of the class D amplifier, it may constantly run at full output swing, minimizing the source of error.

Figure 16A:
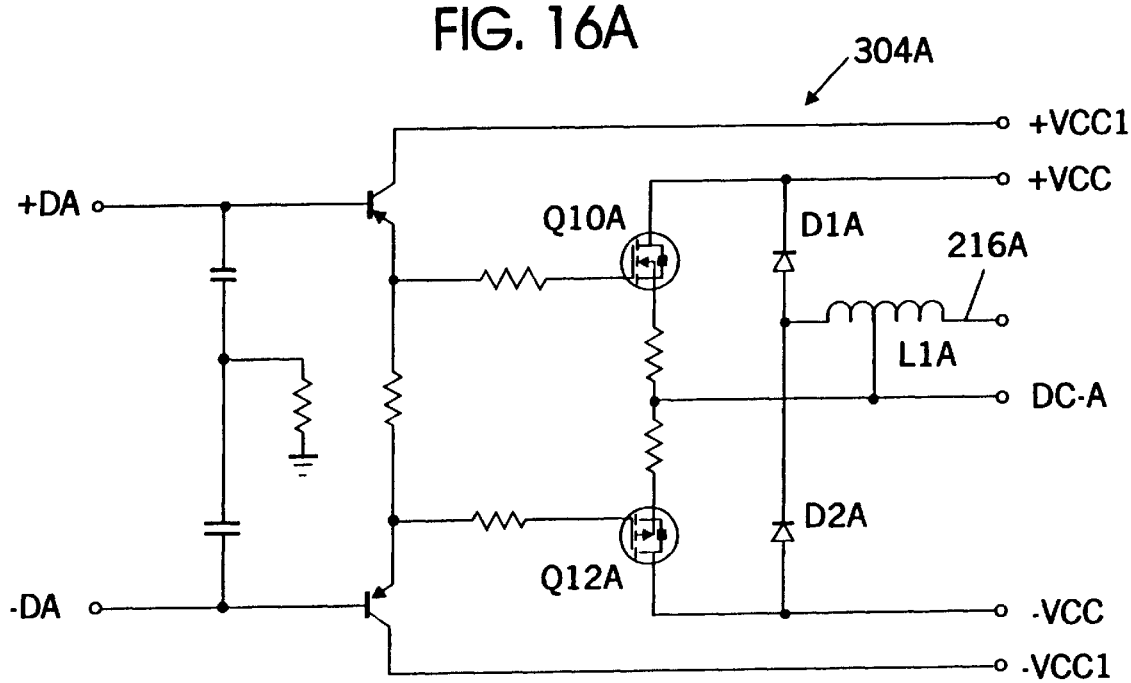
FIGS. 16A and 16B illustrate driver and output stages for a power amplifier of FIG. 14.
Figure 16B:
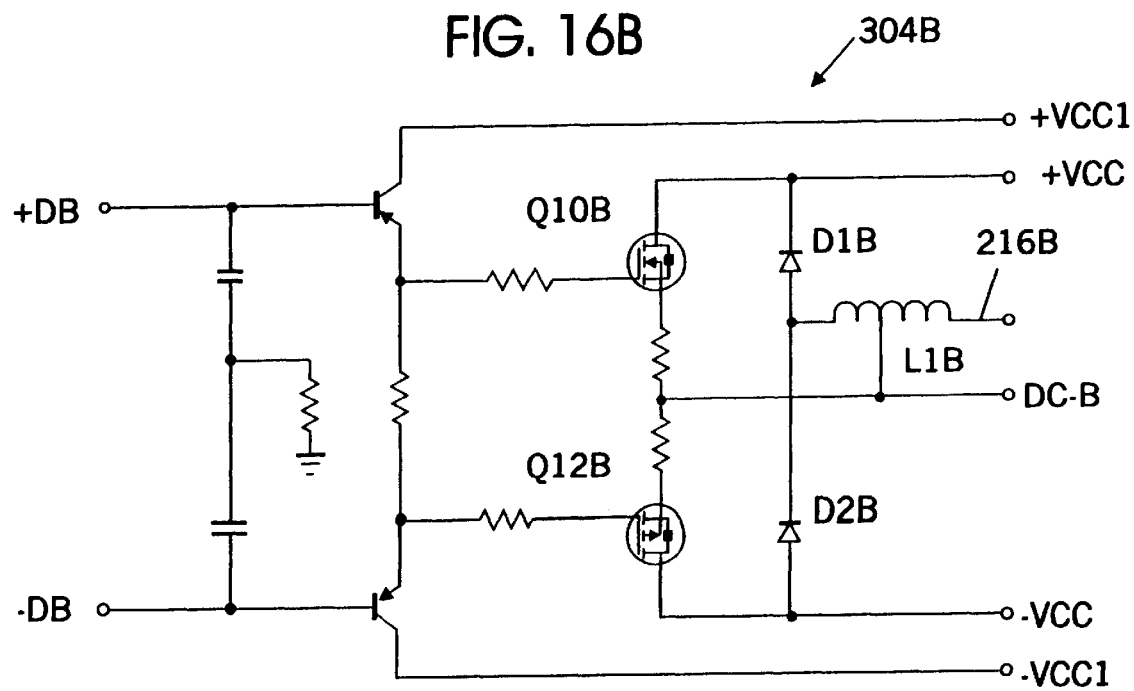

FIGS. 16A and 16B illustrate the driver and output stages 304A and 304B. Flyback diodes D1A, D2A, D1B and D2B are used to return energy to the power supply. In order to reduce pedestal errors, these diodes preferably clamp the output voltage at the same level as the saturation point of the output power transistors. Tapped inductors L1A and L1B are used in FIGS. 16A and 16B respectively to accomplish this. A pair of ±2 V supplies, referenced below the ±VCC supply, may be used in conjunction with multi-diode/resistor breakpoint networks.

Inductors L1A and L1B may also represent the first inductive section of the low pass filter 208 of FIG. 6. Taps of inductors L1A and L1B cause flyback diodes D1A, D1B, D2A and D2B to conduct at the saturation points of transistors Q10A, Q12A, Q1OB and Q12B respectively. This can prevent reverse current flow through transistors Q10A, Q1OB, Q12A and Q12B, and therefore can prevent current flow through their internal substrate diodes. This can allow for the use of external diodes which may be faster and have lower loss, with a clamp level approximately equal to the saturation level of transistors Q10A, Q10B, Q12A and Q12B. This circuit action can reduce and preferably minimize pedestal error due to differing phase angles of voltage and current in the output devices.

Figure 1:
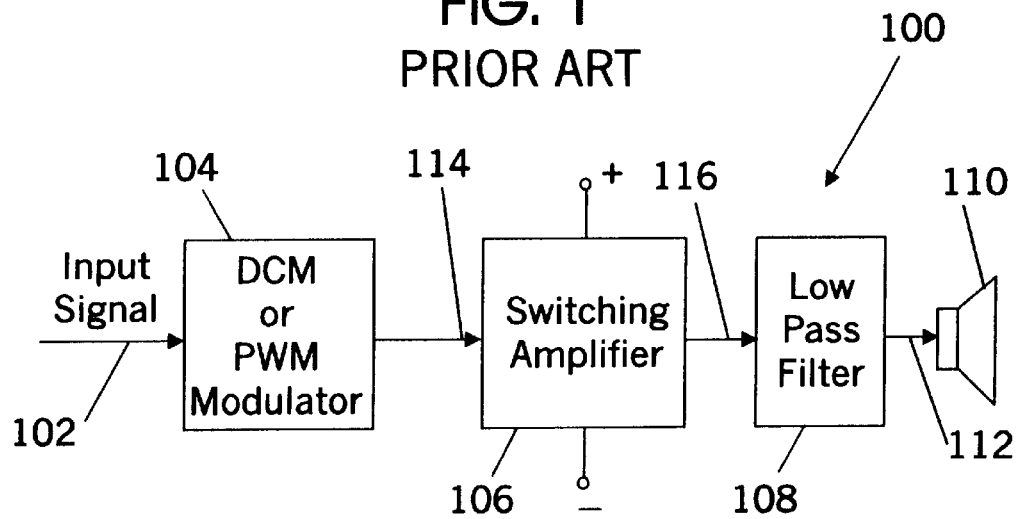
FIG. 1 is a simplified block diagram of a conventional class D amplifier.
Figure 5A:
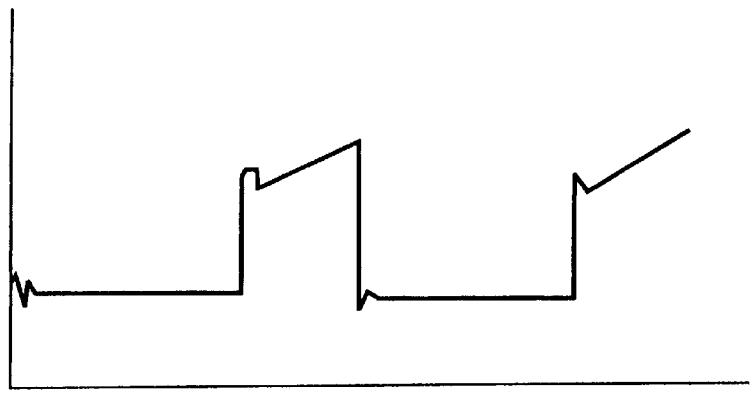
FIGS. 5A and 5B illustrate typical waveforms in a conventional high speed switching power circuit of a class D amplifier.
Figure 5B:
Figure 17A:
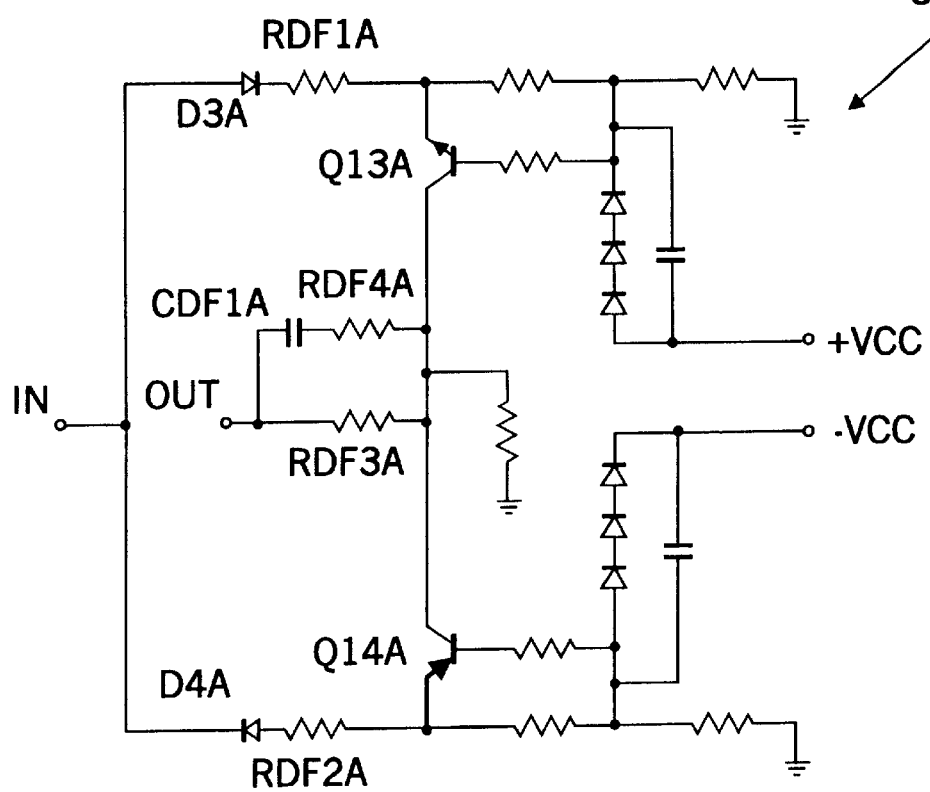
FIGS. 17A and 17B are schematic diagrams of soft clip circuits for a power amplifier for FIG. 14.
Figure 17B:
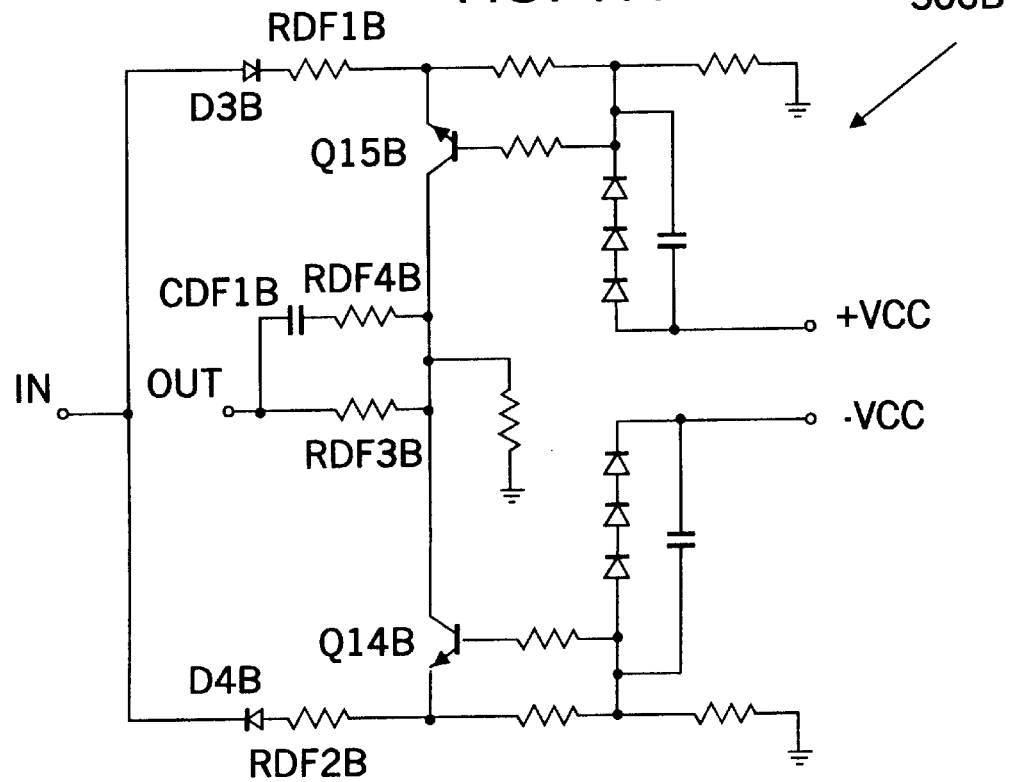

FIGS. 17A and 17B are schematic diagrams of embodiments of soft clip circuits 306A and 306B respectively of FIG. 14. Each soft clip circuit includes a pair of class C common base stages for each of the output phases A and B. These devices become forward biased on alternate signal peaks via D3A, D4A, RDF1A and RDF2A when the phase A output voltage at OC-A approaches saturation. At this point these stages provide additional inverse feedback via RDF3A, RDF4A and CDFA to input node B, thereby effecting input signal compression resulting in controlled overload or soft clipping. The circuit of FIGS. 17B operates in the same manner as the circuit of FIG. 1 7A.

Integrated Circuit Examples

Two examples of modifications of commercially available integrated circuits to incorporate transition zone modulation according to the present invention will now be described. The first example will be a modification of the Linear Technology LT1533 Low Noise Monolithic Regulator integrated circuit. As was described above, in the LT1533, the voltage and current slew rates are independently settable by external programming resistors.

The LT1533 can be modified to provide transition zone modulation according to the present invention by replacing the fixed external programming resistors at the voltage and current slew control pins $R_{VSL}$ and $R_{CSL}$ with circuits that dynamically vary the current on the voltage and current slew control pins as a function of the load. Alternatively, only one of the voltage and current slew control pins may be dynamically varied. Thus, the rise and/or fall times are dynamically varied with the load. It will also be understood by those having skill in the art that in both the LT1533 integrated circuit and in other class D amplifiers according to the present invention, the rise and fall time may also be limited under fault (short circuit) conditions in order to limit dissipation in the power switch.

Transition zone modulation may be used to improve the efficiency of the LT1533, among other reasons, since the longest (slowest) rise and fall times may occur under light to no load operation where losses are low. Thus, the rise and fall times may decrease as the load is increased, thereby improving efficiency under moderate to heavy loads. This may also extend the range of continuous operation of the power switch because a wide range of rise and fall times can be employed. When using transition zone modulation with switching regulators, it may still be desirable to decrease the rise and fall times under fault (short circuit) conditions in order to reduce power switch dissipation.

The Linear Technology Application Note 70 suggests that the operating frequency can be lowered in order to reduce losses when controlled rise and fall times are provided by using the external programming resistors. This can reduce transition loss by making the transitions on a smaller portion of the total duty cycle. When transition zone modulation is employed according to the invention, this constraint can be relaxed, because transition zone modulation can preserve modulation range.

A second example of modification of a commercially available integrated circuit to provide transition zone modulation according to the invention is modification of the SGS Thomson TDA7260 high-efficiency audio PWM driver, marketed by SGS Thomson Microelectronics. This integrated circuit is described in a data sheet entitled "*SGS-Thomson Microelectronics TDA7260 High Efficiency Audio PWM Driver*", pp. 789–801, June 1988, the disclosure of which is hereby incorporated herein by reference. This integrated circuit was recently incorporated by a major U.S. manufacturer for high-end car stereo systems as part of a 25 watt class D amplifier module. The amplifier topology is of the free-running type with overall feedback.

Figure 18:
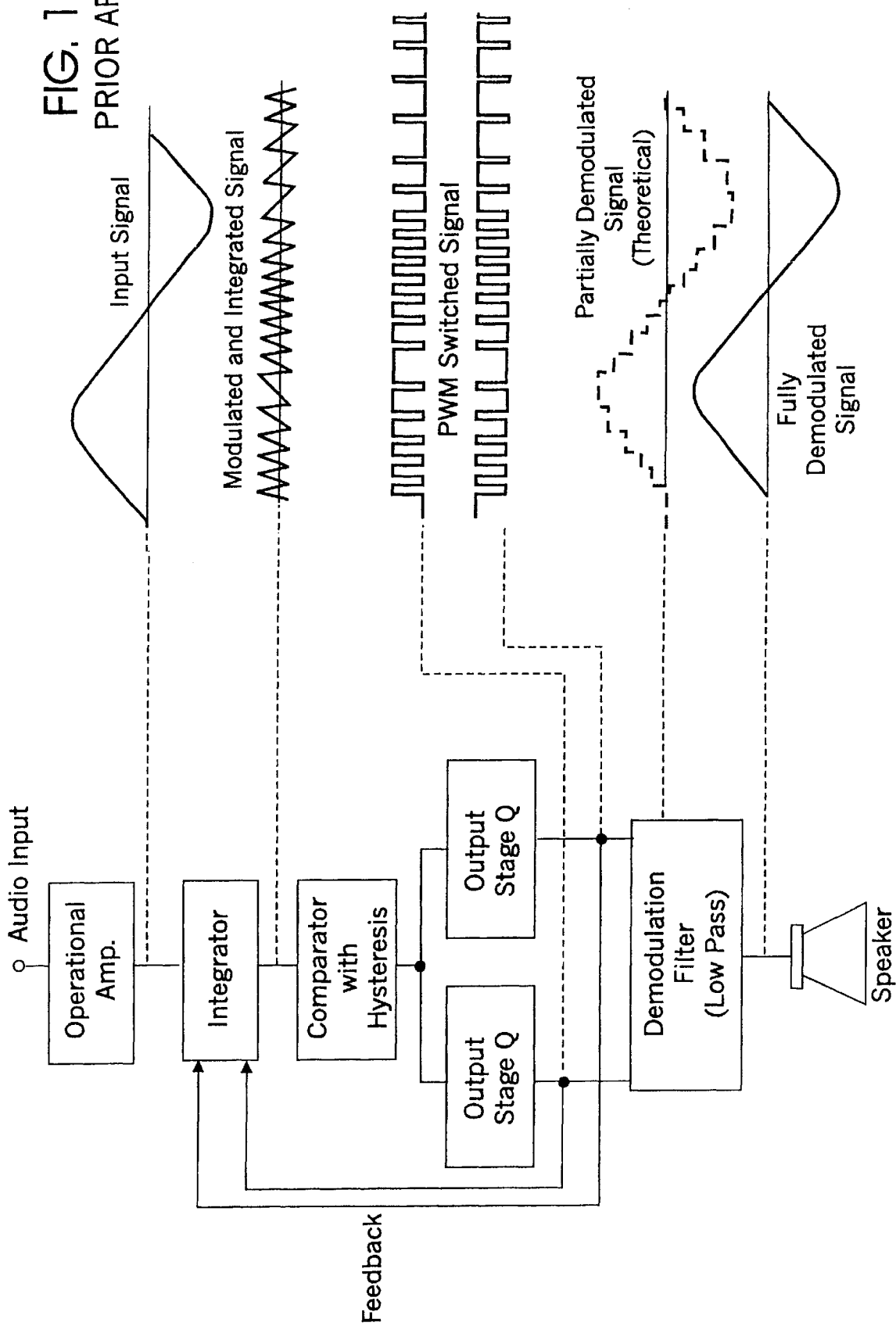
FIG. 18 illustrates a conventional class D amplifier integrated circuit.
Figures 19, 19A:
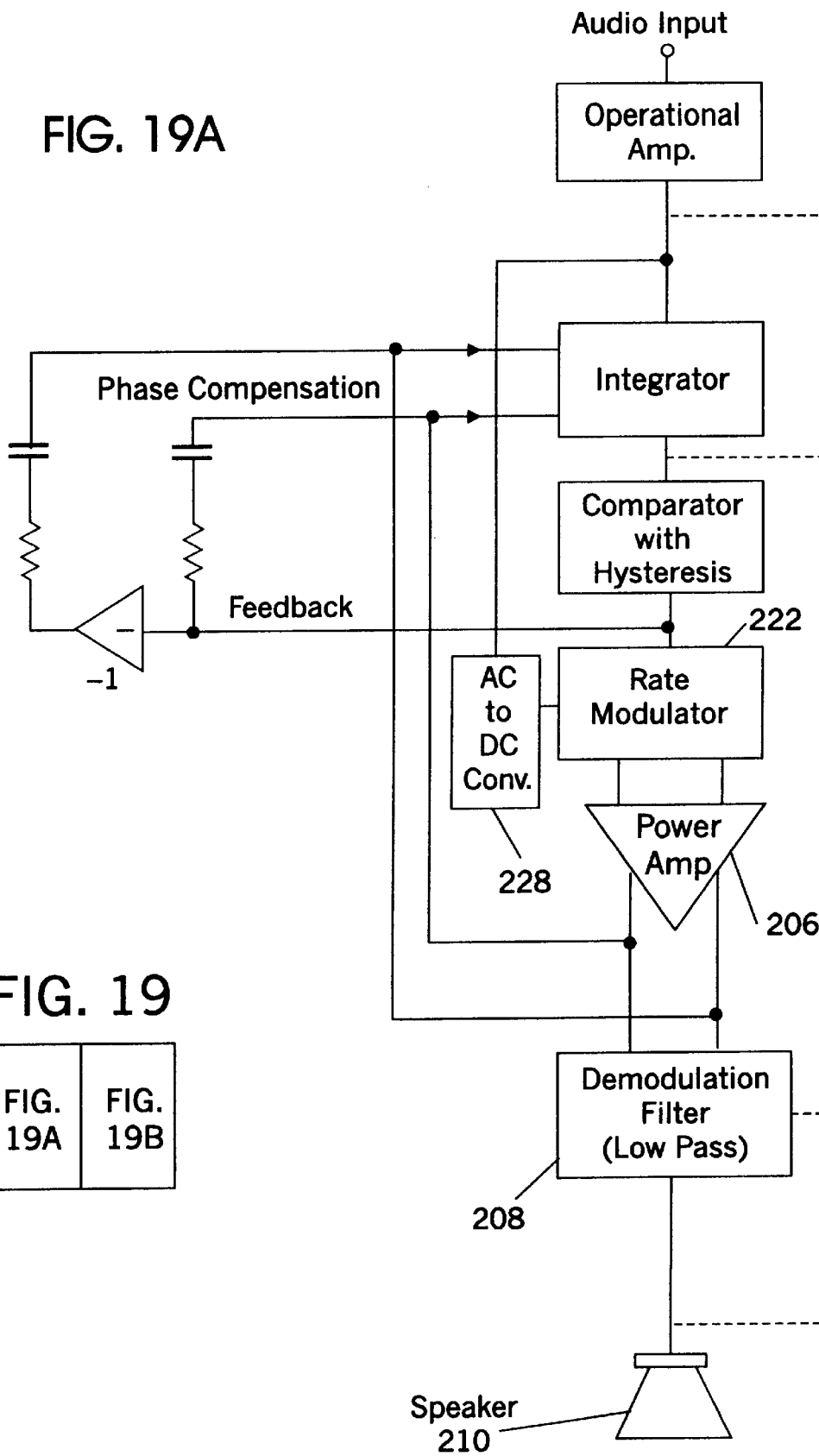

Overall operation of the TDA7232 integrated circuit is described at FIG. 21 of the above-incorporated SGS Thomson Data Sheet, which is reproduced herein as FIG. 18. A modification of the TDA7232 to incorporate transition zone modulation according to the present invention is illustrated in FIG. 19. As shown in FIG. 19, an AC-to-DC converter 228, a rate modulator 222 and a power amplifier 206 are substituted for the output stages of the TDA7232. Trapezoidal PWM switched signal waveforms are also shown in FIG. 19, compared to the square wave PWM switched signal waveforms of FIG. 18. It will be understood that other modifications of the TDA7232 to incorporate transition zone modulation may also be made.

The TDA7232 includes overall feedback that surrounds the pulse width modulator, which may be undesirable due to spurious switching noise artifacts or undesired residual signals. Moreover, a decrease in efficacy may be produced with increasing frequency. The problems can be reduced and preferably eliminated when using transition zone modulation according to the present invention.

As shown in FIG. 19, phase compensation may also be provided to the integrator input. Phase compensation may be difficult to provide in the standard TDA7232 of FIG. 18 due to the generally noisy switching character of such power stages that are difficult to compensate for accurately, especially at lower modulation levels. In contrast, the transition zone modulation waveform's trapezoidal shape can be predictably compensated. Proper compensation tactics can allow correction over the full range of transition zone modulation activity.

The AC-to-DC converter 228 supplies the control signal for the rate modulator 222. It causes the transition rate to change with input signal level. The rate control signal action may be limited to approximately ±10% modulation by an adjustable current source of the rate modulator 222, as was already described. Feed forward compensation of the transition rates versus power supply voltage may also be applied to the class D amplifier of FIG. 19. Servo correction may also be applied to reduce output filter sensitivity with loading effects. Accordingly, the performance of existing integrated circuit class D amplifiers may be improved by providing transition zone modulation according to the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A class D amplifier that amplifies an input signal to produce an analog output signal, comprising:

a first circuit that produces a trapezoidal wave, at least one of the width and the duty cycle of which, and at least one of the rise and fall times of which, are dynamically modulated as a function of the input signal; and a second circuit that converts the trapezoidal wave into the analog output signal;

wherein the first circuit comprises:

a duty cycle modulator that dynamically modulates the duty cycle of a square wave as a function of the input signal; and a rate modulator that is responsive to the duty cycle modulator and to the input signal, to dynamically modulate at least one of the rise and fall times of the duty cycle modulated square wave, to produce the trapezoidal wave.

2. A class D amplifier that amplifies an input signal to produce an analog output signal, comprising:

a first circuit that produces a trapezoidal wave, at least one of the width and the duty cycle of which, and at least one of the rise and fall times of which, are dynamically modulated as a function of the input signal; and a second circuit that converts the trapezoidal wave into the analog output signal;

wherein the first circuit comprises:

a width modulator that dynamically modulates the width of a square wave as a function of the input signal; and a rate modulator that is responsive to the width modulator and to the input signal, to dynamically modulate at least one of the rise and fall times of the width modulated square wave, to produce the trapezoidal wave.

3. A class D amplifier according to claim 1 wherein the first circuit increases at least one of the rise and fall times in inverse proportion to the amplitude of the input signal.

4. A class D amplifier according to claim 1 wherein the first circuit increases at least one of the rise and fall times in inverse proportion to the DC value of the input signal.

5. A class D amplifier according to claim 1 wherein the first circuit produces a trapezoidal wave, both the rise and fall times of which are dynamically modulated as a function of the input signal.

6. A class D amplifier according to claim 1 further comprising an AC to DC converter that converts the input signal to DC, and that supplies the input signal so converted to the rate modulator.

7. A class D amplifier according to claim 2 further comprising an AC to DC converter that converts the input signal to DC, and that supplies the input signal so converted to the rate modulator.

8. A class D amplifier that amplifies an input signal to produce an analog output signal, comprising:

a first circuit that produces a trapezoidal wave, at least one of the rise and fall times of which are dynamically modulated as a function of the input signal; and a second circuit that converts the trapezoidal wave into the analog output signal, wherein the second circuit comprises a low pass filter.

9. A class D amplifier that amplifies an input signal to produce an analog output signal, comprising:

a first circuit that produces a trapezoidal wave, at least one of the rise and fall times of which are dynamically modulated as a function of the input signal;

a second circuit that converts the trapezoidal wave into the analog output signal; and a linear amplifier that is connected between the first and second circuits, to amplify the trapezoidal wave.

10. A class D amplifier that amplifies an input signal to produce an analog output signal, comprising:

a first circuit that dynamically modulates at least one of the width and the duty cycle of, and at least one of the rise and fall times of, a square wave as a function of the input signal; and a second circuit that converts the square wave so modulated into the analog output signal;

wherein the first circuit comprises:

a duty cycle modulator that dynamically modulates the duty cycle of a square wave as a function of the input signal; and a rate modulator that is responsive to the duty cycle modulator and to the input signal, to dynamically modulate at least one of the rise and fall times of the duty cycle modulated square wave.

11. A class D amplifier that amplifies an input signal to produce an analog output signal comprising:

a first circuit that dynamically modulates at least one of the width and the duty cycle of, and at least one of the rise and fall times of, a square wave as a function of the input signal; and a second circuit that converts the square wave so modulated into the analog output signal;

wherein the first circuit comprises:

a width modulator that dynamically modulates the width of a square wave as a function of the input signal; and a rate modulator that is responsive to the width modulator and to the input signal, to dynamically modulate at least one of the rise and fall times of the width modulated square wave.

12. A class D amplifier that amplifies an input signal to produce an analog output signal, comprising:

a first circuit that dynamically modulates at least one of the rise and fall times of a square wave as a function of the input signal;

a second circuit that converts the square wave so modulated into the analog output signal, wherein the second circuit comprises a low pass filter.

13. A class D amplifier that amplifies an input signal to produce an analog output signal, comprising:

a first circuit that dynamically modulates at least one of the rise and fall times of a square wave as a function of the input signal;

a second circuit that converts the square wave so modulated into the analog output signal; and a linear amplifier that is connected between the first and second circuits.

14. A class D amplifier according to claim 12 wherein the first circuit increases at least one of the rise and fall times in inverse proportion to the amplitude of the input signal.

15. A class D amplifier according to claim 12 wherein the first circuit increases at least one of the rise and fall times in inverse proportion to the DC value of the input signal.

16. A class D amplifier according to claim 12 wherein the first circuit dynamically modulates both the rise and fall times of the square wave as a function of the input signal.

17. A class D amplifier according to claim 10 further comprising an AC to DC converter that converts the input signal to DC, and that supplies the input signal so converted to the rate modulator.

18. A class D amplifier according to claim 1 further comprising an AC to DC converter that converts the input signal to DC, and that supplies the input signal so converted to the rate modulator.

19. A class D amplifier that amplifies an input seal to produce an analog output signal, comprising:

a first circuit that dynamically modulates at least one of the width and the duty cycle of, and the slew rate of, a square wave as a function of the input signal; and a second circuit that converts the square wave so modulated into the analog output signal;

wherein the first circuit comprises:

a duty cycle modulator that dynamically modulates the duty cycle of a square wave as a function of the input signal; and a rate modulator that is responsive to the duty cycle modulator and to the input signal, to dynamically modulate the slew rate of the duty cycle modulated square wave.

20. A class D amplifier that amplifies an input signal to produce an analog output signal comprising:

a first circuit that dynamically modulates at least one of the width and the duty cycle of, and the slew rate of, a square wave as a function of the input signal; and a second circuit that converts the square wave so modulated into the analog output signal, wherein the first circuit comprises:

a width modulator that dynamically modulates the width of a square wave as a function of the input signal; and a rate modulator that is responsive to the width modulator and to the input signal, to dynamically modulate the slew rate of the width modulated square wave.

21. A class D amplifier according to claim 19 further comprising an AC to DC converter that converts the input signal to DC, and that supplies the input signal so converted to the rate modulator.

22. A class D amplifier according to claim 20 further comprising an AC to DC converter that converts the input signal to DC, and that supplies the input signal so converted to the rate modulator.

23. A class D amplifier that amplifies an input signal to produce an analog output signal, comprising:

a first circuit that dynamically modulates the sley rate of a square wave as a function of the input signal; and a second circuit that converts the square wave so modulated into the analog output signal, wherein the second circuit comprises a low pass filter.

24. A class D amplifier that amplifies an input signal to produce an analog output signal, comprising:

a first circuit that dynamically modulates the slew rate of a square wave as a function of the input signal;

a second circuit that converts the square wave so modulated into the analog output signal; and a linear amplifier that is connected between the first and second circuit.

25. A class D amplifier according to claim 24 wherein the first circuit increases the slew rate in direct proportion to the amplitude of the input signal.

26. A class D amplifier according to claim 24 wherein the first circuit increases the slew rate in direct proportion to the DC value of the input signal.

27. A class D amplifier according to claim 24 wherein the first circuit dynamically modulates both the rise and fall slew rates of the square wave as a function of the input signal.

28. A class D amplifier that amplifies an input signal to produce an analog output signal, comprising:

a first circuit that dynamically modulates at least one of the width and the duty cycle of, and the transition zone of, a square wave as a function of the input signal; and a second circuit that converts the square wave so modulated into the analog output signal;

wherein the first circuit comprises:

a duty cycle modulator that dynamically modulates the duty cycle of a square wave as a function of the input signal; and a rate modulator that is responsive to the duty cycle modulator and to the input signal, to dynamically modulate the transition zone of the duty cycle modulated square wave.

29. A class D amplifier that amplifies an input signal to produce an analog output signal, comprising:

a first circuit that dynamically modulates at least one of the width and the duty cycle of, and the transition zone of, a square wave as a function of the input signal; and a second circuit that converts the square wave so modulated into the analog output signal;

wherein the first circuit comprises:

a width modulator that dynamically modulates the width of a square wave as a function of the input signal; and a rate modulator that is responsive to the width modulator and to the input signal, to dynamically modulate the transition zone of the width modulated square wave.

30. A class D amplifier according to claim 28 further comprising an AC to DC converter that converts the input signal to DC, and that supplies the input signal so converted to the rate modulator.

31. A class D amplifier according to claim 29 further comprising an AC to DC converter that converts the input signal to DC, and that supplies the input signal so converted to the rate modulator.

32. A class D amplifier according to claim 29 wherein the first circuit increases the transition zone in inverse proportion to the amplitude of the input signal.

33. A class D amplifier according to claim 29 wherein the first circuit increases the transition zone in inverse proportion to the DC value of the input signal.

34. A class D amplifier according to claim 29 wherein the first circuit dynamically modulates both the rise and fall transition zones as a function of the input signal.

35. A class D amplifier that amplifies an input signal to produce an analog output signal, comprising:

a first circuit that dynamically modulates the transition zone of a square wave as a function of the input signal; and a second circuit that converts the square wave so modulated into the analog output signal, wherein the second circuit comprises a low pass filter.

36. A class D amplifier that amplifies an input signal to produce an analog output signal, comprising:

a first circuit that dynamically modulates the transition zone of a square wave as a function of the input signal;

a second circuit that converts the square wave so modulated into the analog output signal; and a linear amplifier that is connected between the first and second circuits.

37. A method of amplifying an input signal to produce an analog output signal, comprising the steps of:

producing a trapezoidal wave, at least one of the width and the duty cycle of which, and at least one of the rise and fall times of which, are dynamically modulated as a function of the input signal; and converting the trapezoidal wave into the analog output signal:

wherein the producing step comprises the steps of:

first dynamically modulating the duty cycle of a square wave as a function of the input signal; and then dynamically modulating at least one of the rise and fall times of the duty cycle modulated square wave as a function of the input signal, to produce the trapezoidal wave.

38. A method of amplifying an input signal to produce an analog output signal, comprising the steps of:

producing a trapezoidal wave, at least one of the width and the duty cycle of which, and at least one of the rise and fall times of which, are dynamically modulated as a function of the input signal; and converting the trapezoidal wave into the analog output signal;

wherein the producing step comprises the steps of:

first dynamically modulating the width of a square wave as a function of the input signal; and then dynamically modulating at least one of the rise and fall times of the width modulated square wave as a function of the input signal, to produce the trapezoidal wave.

39. A method according to claim 37 wherein the step of then dynamically modulating comprises the steps of:

converting the input signal to DC; and then dynamically modulating at least one of the rise and fall times of the duty cycle modulated square wave as a function of the input signal so converted.

40. A method according to claim 38 wherein the step of then dynamically modulating comprises the steps of:

converting the input signal to DC; and then dynamically modulating at least one of the rise and fall times of the width modulated square wave, as a function of the input signal.

41. A method according to claim 37 wherein the producing step comprises the step of increasing at least one of the rise and fall times in inverse proportion to the amplitude of the input signal.

42. A method according to claim 37 wherein the producing step comprises the step of increasing at least one of the rise and fall times in inverse proportion to the DC value of the input signal.

43. A method according to claim 37 wherein the producing step comprises the step of producing a trapezoidal wave, both the rise and fall times of which are dynamically modulated as a function of the input signal.

44. A method of amplifying an input signal to produce an analog output signal, comprising the steps of:

producing a trapezoidal wave, at least one of the rise and fall times of which are dynamically modulated as a function of the input signal; and converting the trapezoidal wave into the analog output signal by low pass filtering the trapezoidal wave into the analog output signal.

45. A method of amplifying an input signal to produce an analog output signal, comprising the steps of:

producing a trapezoidal wave, at least one of the rise and fall times of which are dynamically modulated as a function of the input signal;

linearly amplifying the trapezoidal wave; and converting the trapezoidal wave so amplified into the analog output signal.

46. A method of amplifying an input signal to produce an analog output signal, comprising the steps of:

dynamically modulating at least one of the width and the duty cycle of, and at least one of the rise and fall times of, a square wave as a function of the input signal; and converting the square wave so modulated into the analog output signal;

wherein the dynamically modulating step comprises the steps of:

first dynamically modulating the duty cycle of a square wave as a function of the input signal; and then dynamically modulating at least one of the rise and fall times of the duty cycle-modulated square wave as a function of the input signal.

47. A method of amplifying an input signal to produce an analog output signal, comprising the steps of:

dynamically modulating at least one of the width and the duty cycle, of and at least one of the rise and fall times of, a square wave as a function of the input signal; and converting the square wave so modulated into the analog output signal;

wherein the dynamically modulating step comprises the steps of:

first dynamically modulating the width of a square wave as a function of the input signal; and then dynamically modulating at least one of the rise and fall times of the width modulated square wave.

48. A method according to claim 46 wherein the step of then dynamically modulating comprises the steps of:

converting the input signal to DC; and then dynamically modulating at least one of the rise and fall times of the duty cycle-modulated square wave as a function of the input signal so converted.

49. A method according to claim 47 wherein the step of then dynamically modulating comprises the steps of:

converting the input signal to DC;

then dynamically modulating at least one of the rise and fall times of the width modulated square wave.

50. A method according to claim 47 wherein the dynamically modulating step comprises the step of increasing at least one of the rise and fall times in inverse proportion to the amplitude of the input signal.

51. A method according to claim 47 wherein the dynamically step comprises the step of increasing at least one of the rise and fall times in inverse proportion to the DC value of the input signal.

52. A method according to claim 47 wherein the dynamically modulating step comprises the step of dynamically modulating both the rise and fall times of the square wave as a function of the input signal.

53. A method of amplifying an input signal to produce an analog output signal, comprising the steps of:

dynamically modulating at least one of the rise and fall times of a square wave as a function of the input signal; and converting the square wave so modulated into the analog output signal by low pass filtering the square wave so modulated into the analog output signal.

54. A method of amplifying an input signal to produce an analog output signal, comprising the steps of:

dynamically modulating at least one of the rise and fall times of a square wave as a function of the input signal;

linearly amplifying the square wave so modulated; and converting the square wave so modulated and linearly amplified into the analog output signal.

55. A method of amplifying an input signal to produce an analog output signal, comprising the steps of:

dynamically modulating at least one of the width and the duty cycle of, and the slew rate of, a square wave as a function of the input signal; and converting the square wave so modulated into the analog output signal;

wherein the dynamically modulating step comprises the steps of:

first dynamically modulating the duty cycle of a square wave as a function of the input signal; and then dynamically modulating the slew rate of the duty cycle modulated square wave.

56. A method of amplifying an input signal to produce an analog output signal, comprising the steps of:

dynamically modulating at least one of the width and the duty cycle of, and the slew rate of, a square wave as a function of the input signal; and converting the square wave so modulated into the analog output signal;

wherein the dynamically modulating step comprises the steps of:

first dynamically modulating the width of a square wave as a function of the input signal; and then dynamically modulating the slew rate of the width modulated square wave.

57. A method according to claim 55 wherein the step of dynamically modulating comprises the steps of:

converting the input signal to DC; and then dynamically modulating the slew rate of the duty cycle modulated square wave as a function of the input signal so converted.

58. A method according to claim 56 wherein the step of dynamically modulating comprises the steps of:

converting the input signal to DC; and then dynamically modulating the slew rate of the width modulated square wave as a function of the input signal so converted.

59. A method of amplifying an input signal to produce an analog output signal, comprising the steps of:

dynamically modulating the slew rate of a square wave as a function of the input signal; and converting the square wave so modulated into the analog output signal by low pass filtering the square wave so modulated into the analog output signal.

60. A method of amplifying an input signal to produce an analog output signal, comprising the steps of:

dynamically modulating the slew rate of a square wave as a function of the input signal;

amplifying the square wave so modulated and converting the square wave so modulated and amplified into the analog output signal.

61. A method according to claim 59 wherein the dynamically modulating step comprises the step of increasing the slew rate in direct proportion to the amplitude of the input signal.

62. A method according to claim 59 wherein the dynamically modulating step comprises the step of increasing the slew rate in direct proportion to the DC value of the input signal.

63. A method according to claim 59 wherein the dynamically modulating step comprises the step of dynamically modulating both the rise and fall slew rates of the square wave as a function of the input signal.

64. A method of amplifying an input signal to produce an analog output signal, comprising the steps of:

dynamically modulating at least one of the width and the duty cycle of the transition zone of a square wave as a function of the input signal; and converting the square wave so modulated into the analog output signal;

wherein the dynamically modulating step comprises the steps of;

first dynamically modulating the duty cycle of a square wave as a function of the input signal; and then dynamically modulating the transition zone of the duty cycle modulated square wave.

65. A method of amplifying an input signal to produce an analog output signal, comprising the steps of:

dynamically modulating at least one of the width and the duty cycle of the transition zone of a square wave as a function of the input signal; and converting the square wave so modulated into the analog output signal;

wherein the dynamically modulating step comprises the steps of:

first dynamically modulating the width of a square wave as a function of the input signal; and then dynamically modulating the transition zone of the width modulated square wave.

66. A method according to claim 64 wherein the step of dynamically modulating comprises the steps of:

converting the input signal to DC; and then dynamically modulating the transition zone of the duty cycle modulated square wave as a function of the input signal so converted.

67. A method according to claim 65 wherein the step of dynamically modulating comprises the steps of:

converting the input signal to DC; and then dynamically modulating the transition zone of the width modulated square wave as a function of the input signal so converted.

68. A method of amplifying an input signal to produce an analog output signal, comprising the steps of:

dynamically modulating the transition zone of a square wave as a function of the input signal; and converting the square wave so modulated into the analog output signal by low pass filtering the square wave so modulated into the analog output signal.

69. A method of amplifying an input signal to produce an analog output signal, comprising the steps of:

dynamically modulating the transition zone of a square wave as a function of the input signal;

linearly amplifying the square wave so modulated; and converting the square wave so modulated and linearly amplified into the analog output signal.

70. A method according to claim 69 wherein the dynamically modulating step comprises the step of increasing the transition zone in inverse proportion to the amplitude of the input signal.

71. A method according to claim 69 wherein the dynamically modulating step comprises the step of increasing the transition zone in inverse proportion to the DC value of the input signal.

72. A method according to claim 69 wherein the dynamically modulating step comprises the step of dynamically modulating both the rise and fall transition zones of the square wave as a function of the input signal.

73. A class D amplifier according to claim 2, wherein the trapezoidal wave is a square wave and wherein the at least one of the rise and fall times is the slew rate or the transition zone of the square wave.

74. A method according to claim 66, wherein the trapezoidal wave is a square wave and wherein the at least one of the rise and fall times is the slew rate or the transition zone of the square wave.

75. A class D amplifier according to claim 10, wherein the trapezoidal wave is a square wave and wherein the at least one of the rise and fall times is the slew rate or the transition zone of the square wave.

* * * * *

UNITED STATES PATENT AND TRADEMARK OFFICE
CERTIFICATE OF CORRECTION

PATENT NO. : 6,127,885
DATED : October 3, 2000
INVENTOR(S) : Thomas Phillip Michael Colangelo It is certified that error appears in the above-identified patent and that said Letters Patent is hereby corrected as shown below:

At Column 14, line 16, please delete "1" and substitute – 11 – therefor.
At Column 14, line 20, please delete "seal" and substitute – signal – therefor.
At Column 14, line 59, please delete "sley" and substitute – slew – therefor.
At Column 15, line 4, please delete "circuit" and substitute – circuits – therefor.
At Column 19, line 8, please delete "modulated and" and substitute – modulated; and – therefor.
At Column 19, line 32, please delete "of;" and substitute – of: -- therefor.

Signed and Sealed this

Fifteenth Day of May, 2001

Attest:

NICHOLAS P. GODICI

Attesting Officer     Acting Director of the United States Patent and Trademark Office